United States Patent
Ohkawa et al.

(10) Patent No.: US 7,151,523 B2
(45) Date of Patent: Dec. 19, 2006

(54) BI-DIRECTIONAL SHIFT REGISTER AND DISPLAY DEVICE USING SAME

(75) Inventors: Hiroyuki Ohkawa, Tenri (JP); Yasuyuki Ogawa, Yamatokoriyama (JP); Tamotsu Sakai, Ikoma (JP); Kazuhiro Maeda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 436 days.

(21) Appl. No.: 10/409,056

(22) Filed: Apr. 9, 2003

(65) Prior Publication Data

US 2003/0193465 A1    Oct. 16, 2003

(30) Foreign Application Priority Data

Apr. 10, 2002 (JP) .............................. 2002-108549
Mar. 18, 2003 (JP) .............................. 2003-073998

(51) Int. Cl.
*G09G 3/36* (2006.01)

(52) U.S. Cl. .................................................... 345/100

(58) Field of Classification Search ........... 345/98–100
See application file for complete search history.

(56) References Cited

U.S. PATENT DOCUMENTS 6,232,939 B1 * 5/2001 Saito et al. .................... 345/93
6,418,182 B1 * 7/2002 Suyama et al. ............... 377/69
2002/0075211 A1 * 6/2002 Nakamura .................... 345/87

FOREIGN PATENT DOCUMENTS

| JP | 2-137886 A | 5/1990 |
|---|---|---|
| JP | 10-96888 A | 4/1998 |
| JP | 10-096892 | 4/1998 |
| JP | 11-272226 A | 10/1999 |
| JP | 2001-228830 A | 8/2001 |

OTHER PUBLICATIONS

Korean Office Action mailed Mar. 30, 2005.

* cited by examiner

*Primary Examiner*—Sumati Lefkowitz
*Assistant Examiner*—Rodney Amadiz
(74) *Attorney, Agent, or Firm*—Nixon & Vanderhye P.C.

(57) ABSTRACT

A driving circuit of the present invention includes a signal line switching circuit section that connects each signal line with two adjacent ones of output stages of a shift register circuit, one of the two adjacent ones of output stages following the other, switches over so that the signal lines are, in the switching-over manner and in concert, driven either by the following output stages or by the followed output stages. Thus, it is possible to provide a driving circuit that can be freely placed in any manner, is suitable for many purposes, and is capable of switching shifting directions without needing inversion of a clock signal and without causing shift of pixels, and switching the shifting directions with a simple arrangement even if there are an even number of signal lines for driving effective pixel columns.

16 Claims, 13 Drawing Sheets

BI-DIRECTIONAL SHIFT REGISTER AND DISPLAY DEVICE USING SAME

FIELD OF THE INVENTION

The present invention relates to a driving circuit including a shift register circuit for sequentially shifting, in accordance with a clock signal, data inputted thereto, and to a display device using the same. More specifically, the present invention relates to a driving circuit including a bi-directional shift register circuit that is capable of switching shifting directions, and to a display device using the same.

BACKGROUND OF THE INVENTION

Matrix-type image display devices (display devices) have come into practical use in office automation equipments and audiovisual equipments, and are used in moving picture display devices having large area and high fineness. Recently, such matrix-type image display devices have been developed as to have, on a single substrate, a display section having pixel arrays, and a peripheral driving circuit section. In such matrix-type image display devices, therefore, a driving circuit is integrated with the display section. Such an arrangement is realized by using polycrystalline silicon as a channel layer of a thin film transistor (TFT). By thus integrating the driving circuit section with the display section on the single substrate, it is possible to lower cost of manufacture and to achieve miniaturization of a module.

With reference to FIG. 7, the following describes a basic arrangement of a liquid crystal display device, which is the matrix-type image display device.

In the liquid crystal display device, vertically and horizontally positioned on a substrate (not shown) are gate lines GL (GL(1), GL(2), ... GL(X)), which are a plurality of scanning lines (scanning signal lines), and source lines SL (SL(1), SL(2), ... SL(N)), which are a plurality of data lines (data signal lines). At each intersection of the gate lines GL and the source lines SL, a TFT 30 is provided.

The TFT 30 is connected to one (display electrode) of two electrodes of a pixel capacitor 32 for driving liquid crystal and to one (display electrode) of two electrodes of an auxiliary capacitor 33 for keeping electric charge. The other electrodes of the pixel capacitors 32 and the other electrodes of the auxiliary capacitors 33 are part of a common electrode, which is shared by all the capacitors, and is flatly provided on another substrate arranged face-to-face with the substrate on which the TFT 30 is provided, the liquid crystal being between the two substrates. In other words, the pixel capacitor 32 is formed by compartmentalizing, by the display electrode, the liquid crystal and the common electrode. The pixel capacitor 32 and the TFT 30 connected thereto constitute a display pixel.

In the vicinity of a display section 31 where the TFTs 30 are provided, a source driver (a data signal line driving circuit) 34 and a gate driver (a scanning signal line driving circuit) 35 are provided. Both the source driver 34 and the gate driver 35, as well as the display section 31, are made of polycrystalline silicon, and are integrated onto the single substrate.

The source driver 34 mainly includes a shift register circuit and a plurality of sampling analog switches, which respectively turn ON and OFF in accordance with output signals supplied from output stages of the shift register circuit. The shift register circuit receives, from an external integrated circuit, a clock signal HCK, an inverted clock signal HCKB, which is an inverted signal of the clock signal HCK, and a start pulse HSP. When the start pulse HSP is inputted, the shift register circuit sequentially outputs, from each output stage, the start pulse HSP as a signal having a period being one-half of that of the clock signal HCK or that of the clock signal HCKB. One of two terminals of each sampling analog switch receives, from outside, video data (a video signal) VSIG, while the other of the two terminals of each sampling analog switch is connected to one of the source lines SL. Each of the source lines SL receives the video data VSIG supplied from each output stage of the shift register circuit.

The gate driver 35 mainly includes a shift register circuit. Output stages of the shift register circuit are respectively connected to the gate lines GL. The shift register circuit is receives a clock signal VCK, an inverted clock signal VCKB, which is an inverted signal of the clock signal VCK, and a start pulse VSP. When the start pulse VSP is inputted, the shift register circuit sequentially outputs from each output stage the start pulse VSP as a signal having a period being one-half of that of the clock signal VCK or that of the clock signal VCKB.

To the shift register circuit of the source driver 34 and to the shift register circuit of the gate driver 35, the start pulses HSP and VSP are respectively inputted at the same timing. Each of the source lines SL receives the video data VSIG in accordance with the signals outputted from each output stage of the shift register circuit of the source driver 34. The pixel capacitors 32 and the auxiliary capacitors 33 are respectively supplied with electric charge via the TFTs 30 that are chosen and turned ON in accordance with output signals (a gate signal) from output stages of the shift register circuit of the gate driver 35.

In order to make it possible to freely place such liquid display device, it is necessary to so arrange the liquid display device that a writing position for data to be displayed is symmetrically reversible in upward and downward directions or in rightward and leftward directions. For example, by so arranging the liquid display device that it is possible to switch shifting directions of the shift register circuit in the source driver 34 between the rightward direction and the leftward direction, it is possible to freely inverted displayed images in the rightward and leftward directions.

Therefore, there has been a practice of adopting an arrangement in which the source driver includes a shift register circuit that is capable of switching shifting directions between two directions. Moreover, because in many cases a matrix-type image display device has an even number of source lines SL, an arrangement is necessary in which it is possible to switch the shifting directions even if the matrix-type image display device has an even number of source lines SL.

FIG. 8 shows a circuit arrangement of a conventional source driver including the shift register circuit that is capable of switching shifting directions between two directions. The circuit arrangement is described in Japanese Publication for Unexamined Patent Application, Tokukai, No. 2001-228830 (publication date: Aug. 24, 2001), for example.

In this circuit arrangement, a shift register circuit 51 is unit circuits (not shown) connected in cascade connection. Each of the unit circuits includes four clocked inverters. It is so arranged that each of the unit circuits receives a shifting directions switching signal and an inverted shifting directions switching signal LR (not shown) as well as the clock signal HCK and the inverted clock signal HCKB.

Output stages of the shift register circuit 51 (SR in FIG. 8) are respectively connected to sampling analog switches 53. One of two terminals of each sampling analog switch 53 is connected to a video data line 54, and the others of the two terminals of the sampling analog switches 53 are respectively connected to the source lines SL. The sampling analog switches 53 operate in accordance with respective output signals supplied from output stages of the shift register circuit 51 and control writing of the video data VSIG into the respective source lines SL. In order to limit pulse width of the output signal outputted from each output stage, the shift register circuit 51 may include an arrangement in which the output signal from each output stage and an external signal (for example, the clock signal HCK or the inverted clock signal HCKB) are ANDed.

Here, the shift register circuit 51 has an even number of output stages because the number of output stages are so arranged as to be equal to the number of the source lines SL. However, when the shift register circuit 51 has an even number of output stages, because the clock signal supplied to the leftmost output stage and the clock signal supplied to the rightmost output stage are different (the clock signal HCK is supplied to the leftmost stage, and the inverted clock signal HCKB is supplied to the rightmost stage), shifting timings of the clock signals and the video data VSIG are shifted by half a period when the shifting directions are switched from the rightward direction to the leftward direction, or vice versa. Thus, in order to eliminate such shifting of timings, clock lines 55 have switching circuits 52 for reversing, in switching the shifting directions, polarities of the clock signal HCK and the inverted clock signal HCKB.

With such circuit arrangement, even if there are an even number of the source lines SL, it is possible to switch the shifting directions between the rightward and leftward directions by reversing, in switching the shifting directions, the polarities of the clock signal HCK and the inverted clock signal HCKB by using the switching circuits 52.

FIG. 9 shows a circuit arrangement of another conventional source driver including the shift register circuit that is capable of switching shifting directions between two directions.

According to the circuit arrangement shown in FIG. 9, a shift register circuit 61 has output stages, the number of which is larger than that of the source lines SL by three. A total of three dummy pixel columns 62 for adjustment are provided so as to sandwich effective pixel columns 63 to be driven by the source lines SL. The outmost two dummy pixel columns are always dummy, and do not contribute to displaying. On the other hand, a second pixel column from the right and a second pixel column from the left in FIG. 9 respectively become a dummy pixel column and an effective pixel column, or an effective pixel column and a dummy pixel column, in accordance with the shifting directions. FIG. 9 illustrates a case in which the second pixel column from the right is the dummy pixel column 62, and the second pixel column from the left is the effective pixel column 63.

FIG. 10 shows a circuit arrangement of yet another conventional source driver including the shift register circuit that is capable of switching shifting directions between two directions. An arrangement equivalent to the circuit arrangement is described, for example, in Japanese Publication for Unexamined Patent Application, Tokukaihei, No. 11-272226 (publication date: Oct. 8, 1999).

According to the circuit arrangement shown in FIG. 10, a shift register circuit 71 has output stages, the number of which is larger than that of the source lines SL by one, so that the number of the output stages becomes an odd number. Output stages of the shift register circuit 71 are provided with NAND circuits 72, to which output signals supplied from two adjacent output stages are inputted for NAND operation.

However, the circuit arrangements in FIGS. 8 to 10 have the following problems.

According to the circuit arrangement in FIG. 8, the polarities of the clock signal HCK and the inverted clock signal HCKB are switched when the shifting directions are switched, by providing the switching circuits 52 to the clock lines 55. This causes a problem in dealing with a high clock frequency. In order to respond to the heightened frequency, it is preferable that the circuit arrangement is such that it is possible to directly use the clock signal HCK, the inverted clock signal HCKB, and the start pulse HSP, which are external signals.

On the other hand, according to the circuit arrangements in FIGS. 9 and 10, the shift register circuits 61 and 71 have an odd number of stages, and the clock signal HCK is supplied to the leftmost output stage and the rightmost output stage. Because of this, it is not necessary to switch the polarities of the clock signal HCK and the inverted clock signal HCKB in switching the shifting directions. Therefore, there is no problem in dealing with a high clock frequency.

However, according to the circuit arrangement in FIG. 9, the number of the output stages of the shift register circuit 61 is set to be an odd number, and the second pixel column from the right and the second pixel column from the left are respectively arranged to be the dummy pixel column 62 and the effective pixel column 63, or the effective pixel column 63 and the dummy pixel column 62, in accordance with the shifting directions. This causes a problem that an image displaying position within an image module is shifted by one column.

On the other hand, according to the circuit arrangement in FIG. 10, the shift register circuit 71 has an odd number of output stages. By performing NAND operation, however, the number of output signals supplied from each of the NAND circuits 72 becomes an even number. Because of this, it is possible to obtain equivalent signals in the rightward shifting and the leftward shifting, thereby causing no such problem as in the circuit arrangement in FIG. 9 in which the image is shifted.

According to the circuit arrangement in FIG. 10, it is not necessary to convert external input signals, such as the clock signal HCK and the inverted clock signal HCKB, inputted to the shift register circuit 71. However, because it is so arranged that the output signals supplied from two adjacent output stages in the shift register circuit 71 are NANDed, the output signals supplied from the two adjacent output stages must be outputted in such timing as to overlap with each other. The arrangement of the shift register circuit 71 is thus limited.

On the other hand, the shift register circuit 51 in FIG. 8 and the shift register circuit 61 in FIG. 9 may be so arranged that the output signals supplied from two adjacent output stages are outputted in such timing as to overlap with each other, or in such timing as not to overlap with each other.

Moreover, according to an arrangement in which the output signals supplied from two adjacent output stages are outputted in such timing as to overlap with each other, a HIGH period becomes longer when compared to an arrangement in which the output signals are not overlapped. This results in more electric power consumption if it is so arranged that current is supplied during the HIGH period.

SUMMARY OF THE INVENTION

The object of the present invention is to provide a driving circuit suitable for many purposes, capable of (A) switching shifting directions without needing conversion of external input signals inputted to the shift register circuit and (B) switching the shifting directions with a simple arrangement even if there are an even number of signal lines that are to be driven, and to provide a display device using the same.

To solve the problems above, a driving circuit of the present invention includes a shift register circuit for shifting a start pulse in two directions in accordance with two clock signals having different phases, the driving circuit driving a plurality of signal lines by respectively using output signals supplied from output stages of the shift register circuit, further including: a signal line switching circuit section, associating each signal line with two adjacent ones of the output stages, one of which follows the other, the signal line switching circuit being switchable so that the signal lines are driven either by the following output stages or by the followed output stages. Here, the signal lines are such as data signal lines to which video signals and the like are supplied, and scanning signal lines to which scanning signals and the like are supplied, for example.

According to the above arrangement, by the signal line switching circuit section switching over, the signal lines are, in the switching-over manner and in concert, driven either by the following output stages or by the followed output stages.

When it is set, for example, that the number of output stages of the shift register circuit is an odd number, thus enabling to heighten the clock frequency without needing change to external input signals, and that an even number of signal lines are driven by the odd number of output signals, a displayed image is inevitably shifted by one pixel column between the rightward shifting and the leftward shifting, if relationship between the signal lines and output stages is fixed, as shown by the driving circuit in FIG. 9 as an example. However, by providing the signal line switching circuit section for switching over so as to change, between the rightward shifting and the leftward shifting, correspondence as to which signal line is driven by which output stage, thus shifting the image by one pixel column, it is possible to eliminate the shifting of pixels caused by the different shifting directions.

Although a plurality of pixels aligned in a column along the signal lines are referred to here as a pixel column, this is only for the purpose of explanation. Thus, the term "pixel column" may refer not only to the pixels, among the pixel arrays, aligned along the data signal lines, but, alternatively, to the pixels aligned along the scanning signal lines, though such pixels are usually referred to as a pixel row.

Moreover, to solve the problems above, in a display device of the present invention including (i) pixel arrays including a plurality of effective pixels for displaying an image, (ii) a data signal line driving circuit for supplying a video signal to the pixel arrays, and (iii) a scanning signal line driving circuit for controlling writing of the video signal into the pixels, at least one of the data signal line driving circuit and the scanning signal line driving circuit further includes the driving circuit of the present invention.

As described above, the driving circuit of the present invention is suitable for many purposes, capable of (A) switching shifting directions without needing change to external input signals inputted to the shift register circuit and (B) switching the shifting directions with a simple arrangement even if there are an even number of signal lines that are to be driven.

Therefore, the image display device of the present invention including such driving circuit in at least one of the data signal line driving circuit and the scanning signal line driving circuit is capable of ensuring flexibility in setting-up the display device, while keeping a simple arrangement of said at least one of the data signal line driving circuit and the scanning signal line driving circuit.

For a fuller understanding of the nature and advantages of the invention, reference should be made to the ensuing detailed description taken in conjunction with the accompanying drawings.

DESCRIPTION OF THE EMBODIMENTS

Referring to FIGS. 1 to 6, the following describes an embodiment of the present invention.

Figure 1:
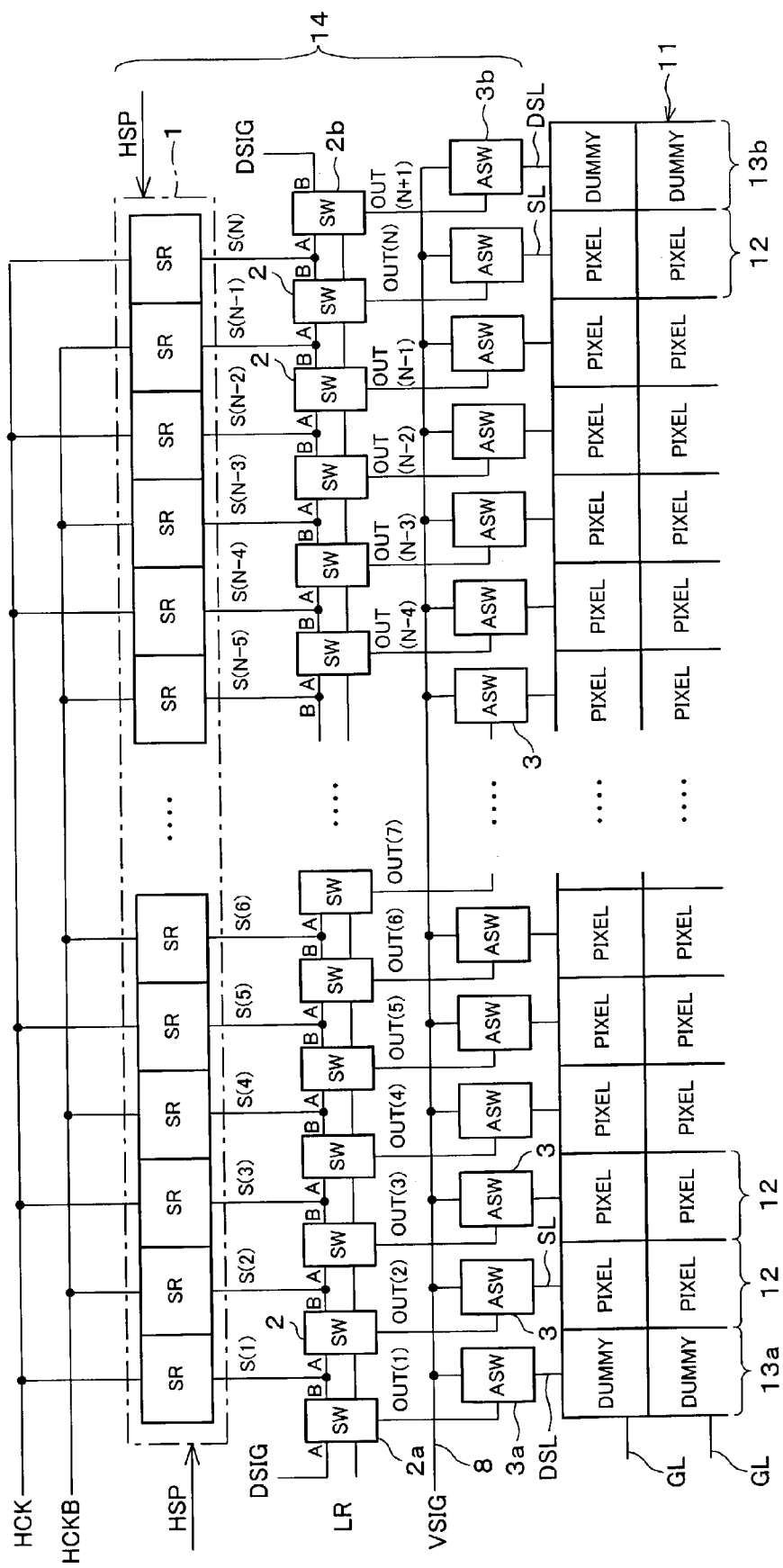
FIG. 1 is a block diagram illustrating an arrangement of a source driver of an embodiment of the present invention.
Figure 7:
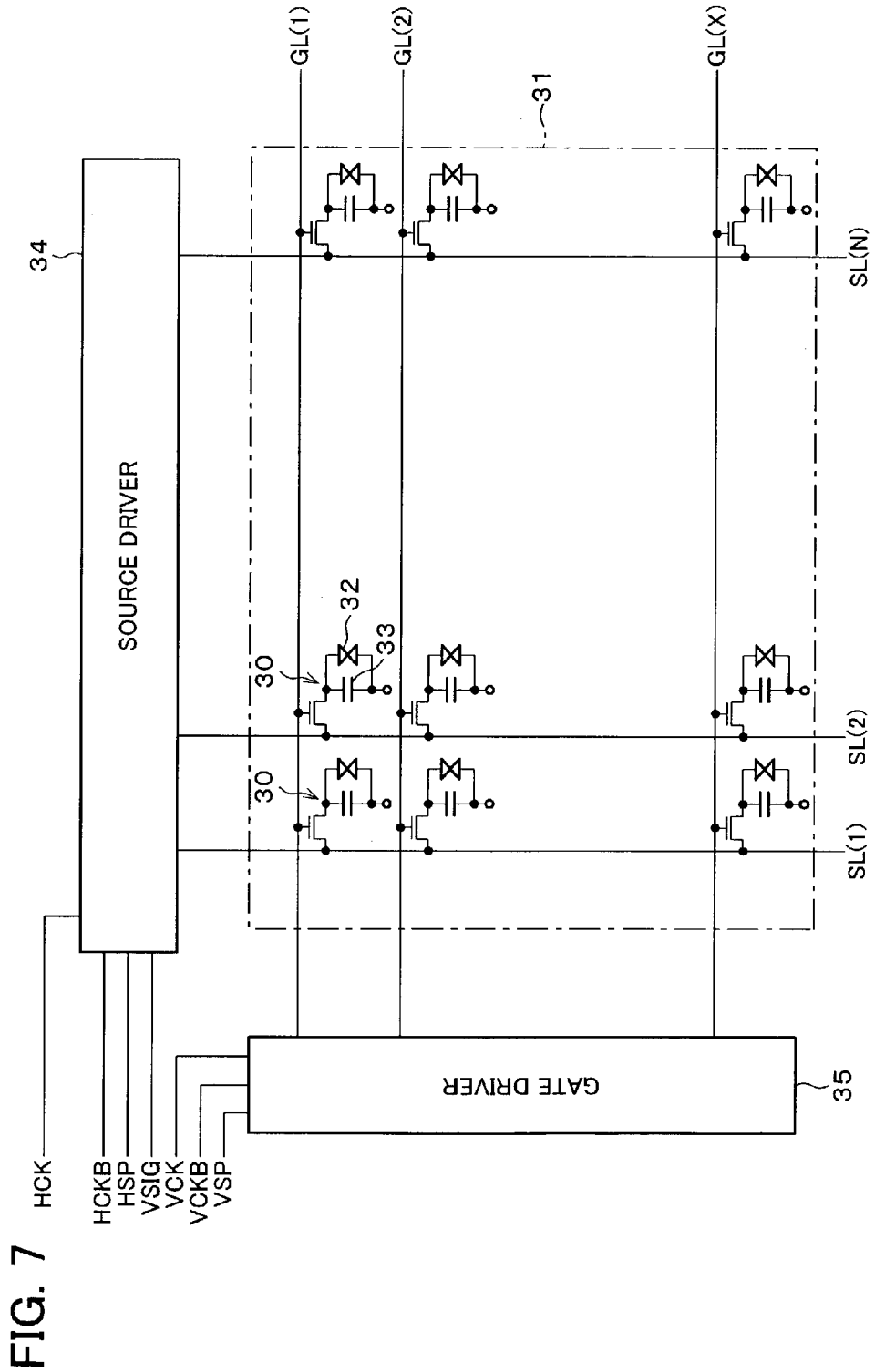
FIG. 7 is a block diagram illustrating an arrangement of a liquid crystal display device that is a matrix-type image display device.

FIG. 1 is a block diagram illustrating a source driver 14 of a matrix-type image display device of the present embodiment to which an arrangement of a driving circuit of the present invention is applied. It is possible to use the source driver 14 as, for example, the source driver 34 of the liquid crystal display device, the basic arrangement of which is shown in FIG. 7.

The source driver 14 includes a shift register circuit 1 that is capable of switching shifting directions between right and left, a plurality of sampling analog switches (analog switch circuits, ASW in FIG. 1) 3, which respectively turn ON and OFF in accordance with output signals supplied from output stages (SR in FIG. 1) of the shift register circuit 1. Further, as a characterizing arrangement of the present invention, the source driver 14 includes a plurality of switching circuits (SW in FIG. 1) 2, between output stages of the shift register circuit 1 and the plurality of sampling analog switches. Each switching circuit 2 supplies, to one of the two adjacent sampling analog switches 3 connected thereto, one of output signals S(1) to S(N) supplied from the output stages of the shift register circuit 1. The plurality of switching circuits constitute a signal line switching circuit section and a group of switching circuits.

Figure 8:
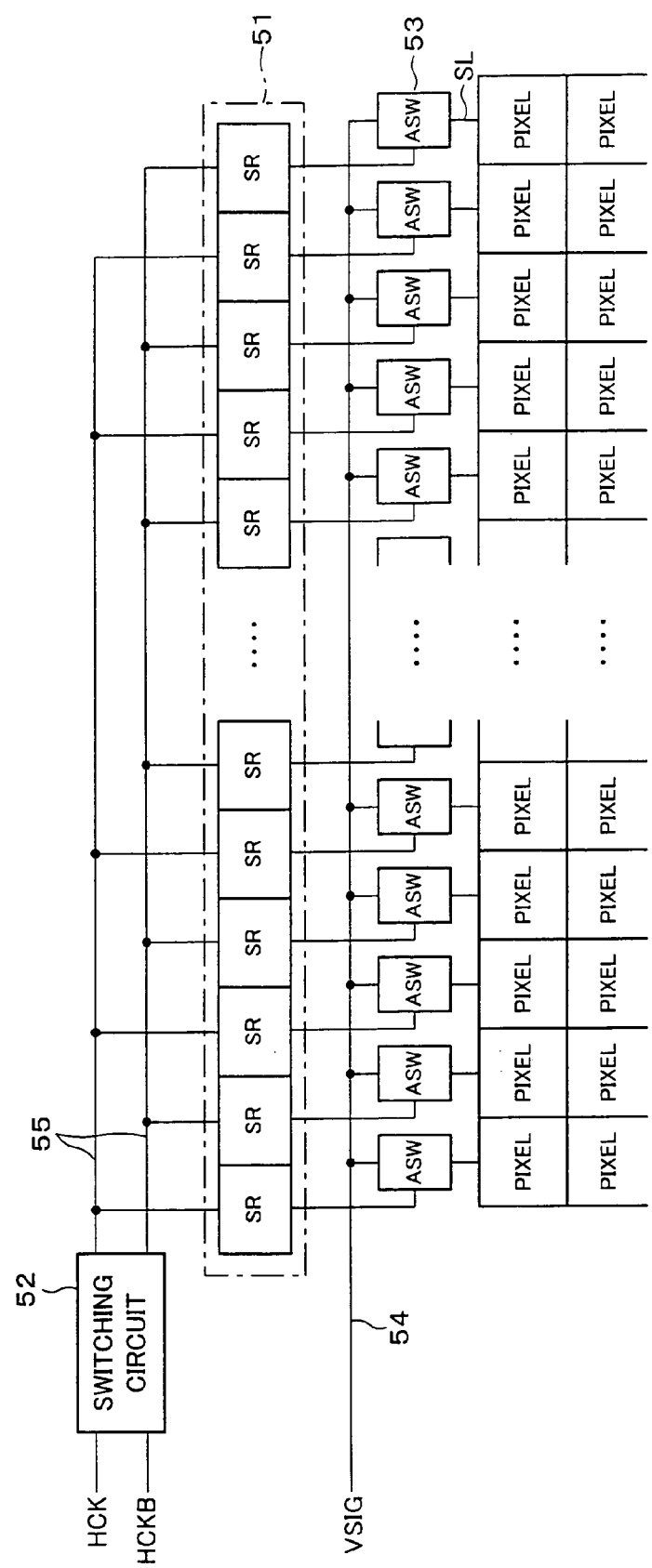
FIG. 8 is a block diagram illustrating an arrangement of a conventional source driver.

As the shift register circuit 1, it is possible to use a shift register circuit similar to the shift register circuit 51 in FIG. 8 described as a prior art, that is, the shift register circuit of such arrangement in which the unit circuits are connected in cascade connection, each of the unit circuits including the four clocked inverters and receiving the shifting directions switching signal and the inverted shifting directions switching signal (not shown) as well as the clock signal HCK and the inverted clock signal HCKB. Note, however, that an arrangement of the shift register circuit 1 is not limited to that of the present embodiment. Moreover, in using a shift register circuit similar to the shift register circuit 51 in FIG. 8, the shift register circuit 1 may be so arranged that the output signal outputted from each output stage and an externally inputted signal (for example, the clock signal HCK or the inverted clock signal HCKB) are ANDed so as to limit pulse width of the output signal outputted from each output stage.

A total number of the output stages of the shift register circuit 1 is N, an odd number, and satisfies N=n+m, where n is a positive even number representing the number of source lines SL, which are effective signal lines to be driven in a display section 11 including pixel arrays shown at the bottom of FIG. 1, and m is a positive odd number. In the present embodiment, it is set that m=1.

Thus, by so arranging the shift register circuit 1 as to have an odd number of output stages, the clock signal HCK is supplied to both the leftmost output stage and the rightmost output stage of the shift register circuit 1.

Specifically, in rightward shifting, the start pulse HSP is supplied to the leftmost output stage of the shift register circuit 1. Then, the start pulse, together with the clock signal HCK, causes the shift register circuit 1 to start the rightward shifting. Meanwhile, in leftward shifting, the start pulse HSP is supplied to the rightmost output stage of the shift register circuit 1. Then, the start pulse and the clock signal HCK cause the shift register circuit 1 to start the leftward shifting.

Thus, in both the rightward shifting and the leftward shifting, the shifting is started in accordance with the start pulse HSP and the clock signal HCK. Because of this, for switching the shifting directions, it is not necessary to switch the polarities of the clock signal HCK and the inverted clock signal HCKB. Therefore, there is no problem in dealing with a high clock frequency.

In the shift register circuit 1, the outmost (m+1)/2 number of stages that are provided at both ends (in this case, one output stage at each of the both ends) among the N number of output stages are selectively switched over between dummy use and actual use in accordance with the shifting directions. (Details are to be described later.) Meanwhile, as described above, each switching circuit 2 supplies, to one of the two adjacent sampling analog switches 3 connected thereto, one of the output signals S(1) to S(N) supplied from the output stages of the shift register circuit 1.

The total number of the switching circuits 2 is N+1, which is greater than the number of output stages N of the shift register circuit by one. In other words, the total number of the switching circuits is greater than n, the number of the effective signal lines, by two. The switching circuits 2 correspond to the sampling analogue switches 3, one by one. Therefore, the total number of the sampling analogue switches 3 is also N+1.

The output signals S(1) to S(N) outputted from the output stages of the shift register circuit 1 are supplied to the respective two adjacent switching circuits 2. Here, Each of the output signals S(1) to S(N) is supplied to the switching circuit 2 on the right via line A, and is supplied to the switching circuit 2 on the left via line B.

Moreover, the leftmost switching circuit 2a among the plurality of switching circuit 2 receives a dummy signal DSIG from line A, and the rightmost switching circuit 2b among the plurality of switching circuit 2 receives a dummy signal DSIG from line B.

The plurality of switching circuits 2 are supplied with a shifting directions switching signal LR for controlling the shifting directions. Each of the switching circuits 2 chooses one of the line A and the line B in accordance with the shifting directions switching signal LR. The shifting directions switching signal LR becomes high level when the rightward shifting is performed and becomes low level when the leftward shifting is performed.

Figure 2:
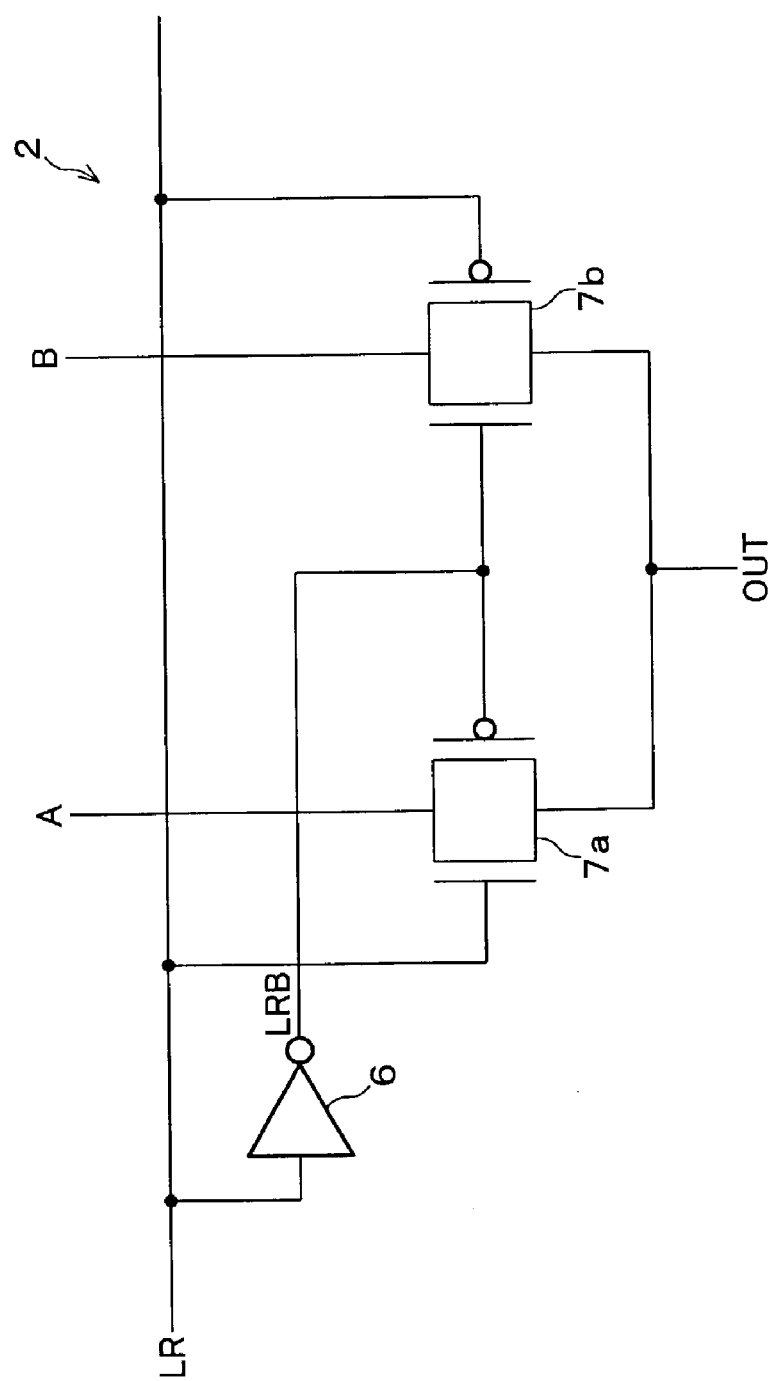
FIG. 2 is a circuit diagram of a switching circuit, provided in the source driver, for switching over so as to decide which signal line is driven by which output stage of the shift register circuit.

Referring to FIG. 2, the following describes an arrangement of the switching circuit 2. The switching circuit 2 includes two analog switches 7a and 7b. One of two terminals of the analog switch 7a is connected to the line A, and one of two terminals of the analog switch 7b is connected to the line B. The other terminals (OUT) of the analog switches 7a and 7b are respectively connected to control terminals of corresponding sampling analog switches 3.

The analog switch 7a directly receives the shifting directions switching signal LR as a control signal, and the analog switch 7b receives an inverted shifting directions switching signal LRB as a control signal via an inverter 6. Therefore, the analog switch 7a turns ON when the shifting directions switching signal LR is high level, and the analog switch 7b turns ON when the shifting directions switching signal LR is low level.

In other words, in the switching circuit 2, the analog switch 7a turns ON and the line A is chosen when the rightward shifting is performed and the shifting direction switching signal LR is high level. On the other hand, the analog switch 7b turns ON and the line B is chosen when the leftward shifting is performed and the shifting direction switching signal LR is low level.

As shown in FIG. 1, signals supplied to the lines A or lines B that are chosen by one of the switching circuits 2 are respectively supplied to the sampling analog switches 3 as output signals OUT(1) to OUT(N+1), and control ON and OFF of said one of the sampling analog switches 3.

One of two terminals of each of the sampling analog switches 3 is commonly connected to a video data line 8 through which the video data VSIG is externally supplied. On the other hand, the other terminals are respectively connected to the effective source lines SL. The sampling analog switches 3 turn ON in accordance with supplies of the output signals S(1) to S(N) from the output stages of the shift register circuit 1 via the switching circuits 2, and send the video data VSIG to the respective effective pixel columns 12 in the display section 11.

Moreover, the leftmost and rightmost sampling analog switches 3a and 3b among the plurality of sampling analog switches 3 are respectively connected to dummy source lines (dummy signal lines) DSL that are for dummy pixel columns 13a and 13b, respectively. The dummy source line DSL connected to the leftmost sampling analog switch 3a is for a dummy pixel column 13a, and the dummy source line DSL connected to the rightmost sampling analog switch 3b is for a dummy pixel column 13b.

In the display section 11, the pixel arrays include effective pixel columns 12 and the dummy pixel columns 13a and 13b. To specify a part of the pixel arrays, a group of the pixels lined in a direction along the gate lines GL is referred to as a row, and a group of the pixels lined in a direction along the source lines SL is referred to as a column.

At the pixel arrays in the display section 11, as shown in FIG. 7, the plurality of gate lines GL are supplied with gate signals from the gate driver (not shown), and each pixel row is sequentially chosen.

The dummy pixel columns 13a and 13b are provided for eliminating adverse effects on displaying caused due to differences in state of the pixels and in components of the capacitors between a central portion and an end portion of the display section 11. By providing the dummy pixel columns 13a and 13b, it is possible to cause the end portion to have similar state of the pixels and the components of the capacitors to those of the central portion, thereby realizing even displaying in the display section 11. Here, because it is so arranged that the dummy pixel columns 13a and 13b are masked, the dummy pixel columns 13a and 13b do not contribute to the displaying.

The video data line 8 commonly connected to each of the sampling analog switches 3 receives pixel signal voltage that is to be supplied to each pixel of the chosen row as the video data VSIG, which is a signal generated in an external integrated circuit. The video data VSIG is sampled and held, by the sampling analog switches 3 that have been sequentially turned ON at the shift register circuit 1, at timing, in each horizontal scanning period, assigned to each column. Then, the video data VSIG is supplied to each pixel as pixel signal voltage corresponding to each display point designated by using the rows and columns.

Figure 3:
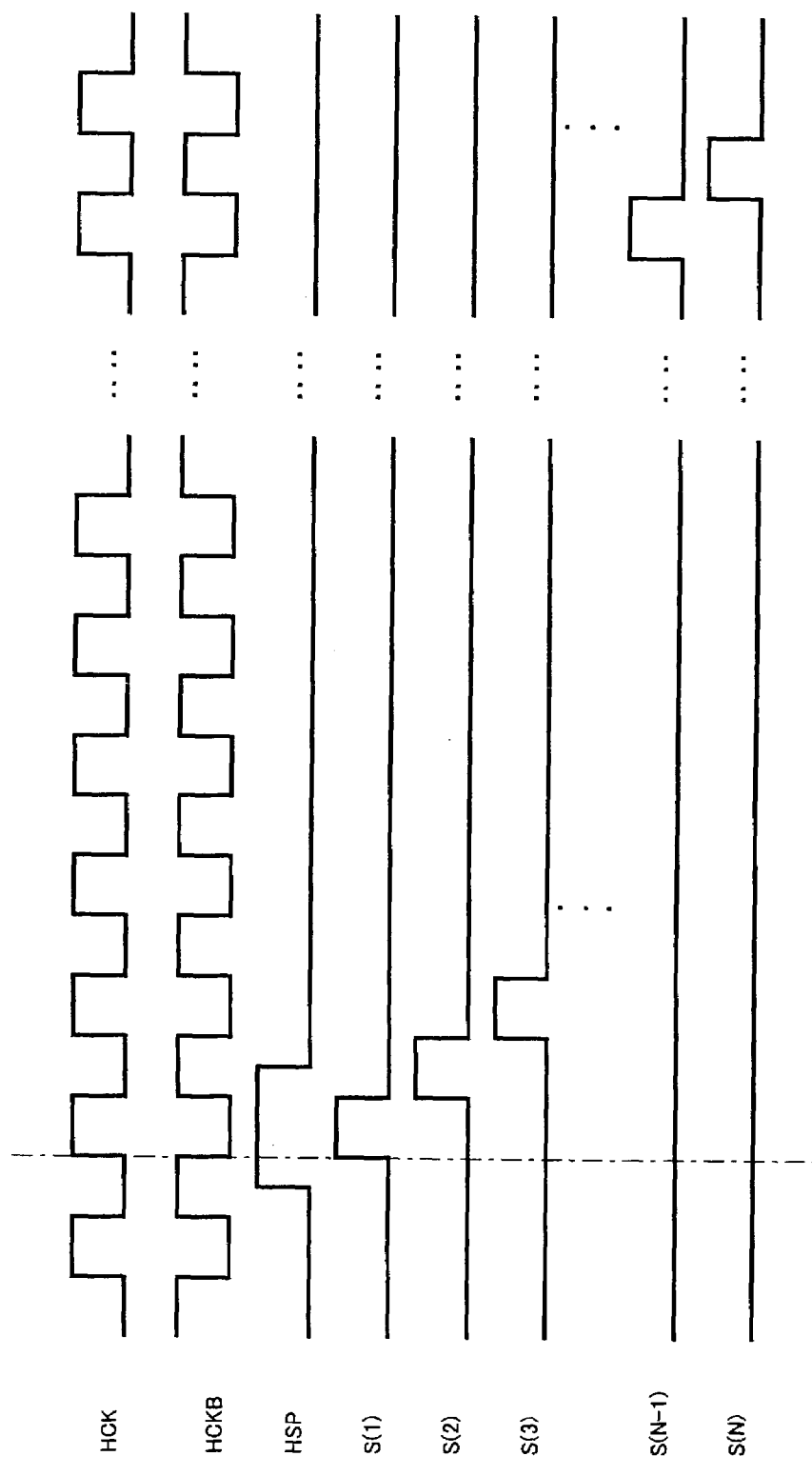
FIG. 3 is a timing chart of the shift register circuit in the source driver when rightward shifting is performed.

FIG. 3 shows operation timing of the shift register circuit 1 in such source lines 4 when the rightward shifting is performed. The shift register circuit 1 receives the clock signal HCK and the clock signal HCKB, which is the inverted signal of the clock signal HCK. The shift register circuit 1 starts shifting operation when the start pulse HSP is inputted to the leftmost output stage.

During half a clock period in which the clock signal HCK becomes high level and overlaps with the start pulse HSP, a first stage in the shift register circuit 1 (that is, the leftmost output stage) outputs a high-level output (S(1)). Then, half the clock period after S(1), a second output stage outputs a high-level output (S(2)). After that, S(3), S(4), . . . are sequentially outputted.

Figure 4:
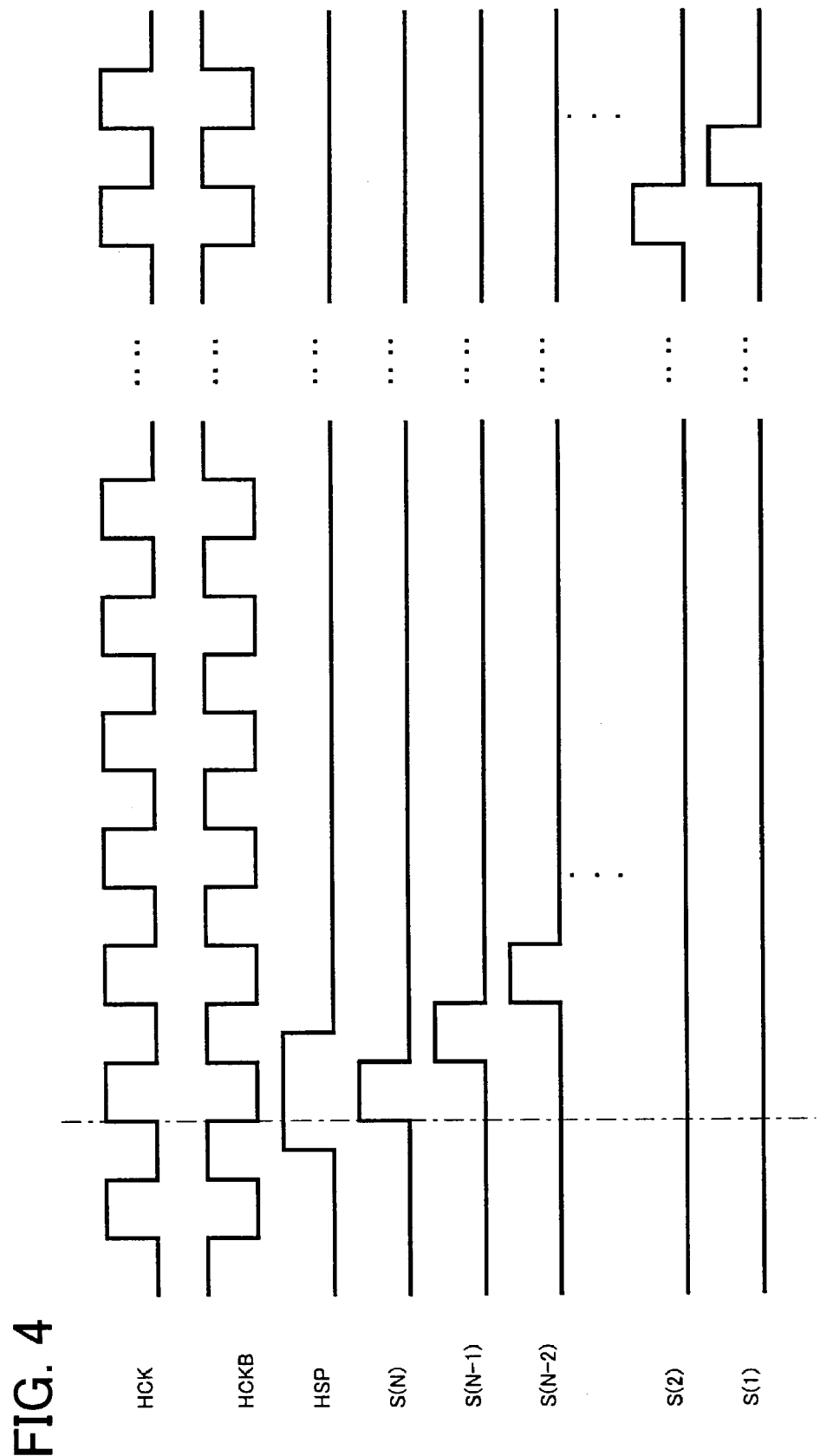
FIG. 4 is a timing chart of the shift register circuit in the source driver when leftward shifting is performed.

Likewise, FIG. 4 shows operation timing of the shift register circuit 1 when the leftward shifting is performed. The shift register circuit 1 starts shifting operation when the start pulse HSP is inputted to the rightmost output stage. During half a clock period in which the clock signal HCK becomes high level and overlaps with the start pulse HSP, a first stage in the shift register circuit 1 (that is, the rightmost output stage) outputs a high-level output (S(N)). Then, as in the rightward shifting, S(N−1), S(N−2), . . . are sequentially outputted.

On the other hand, in the switching circuits 2, because the line A is chosen when the shifting directions switching signal LR is high level (in other words, when the rightward shifting is performed), the leftmost switching circuit 2a supplies, to the leftmost sampling analog switch 3a, the dummy signal DSIG of the line A chosen from the inputted dummy signal DSIG and the inputted output signal S(1). Because the leftmost sampling analog switch 3a is connected to the dummy pixel column 13a via the dummy signal line DSL, the leftmost sampling analog switch 3a does not contribute to actual displaying.

Then, the sampling analog switch 3 following the leftmost sampling analog switch 3a receives the output signal S(1) of the leftmost output stage, and samples the video data VSIG. Afterwards, the sampling analog switch 3 following the leftmost sampling analog switch 3a supplies the video data VSIG to the second pixel column counted from the left, that is, the leftmost pixel column 12 among the effective pixel columns 12. In the switching circuits 2 and the sampling analog switches 3 after the sampling analog switch 3 following the leftmost sampling analog switch 3a, likewise, signals supplied to the line A are chosen, and the video data VSIG is sequentially supplied to each of the effective pixel columns 12.

Then, in the rightmost switching circuit 2b, which is the last column, the signal supplied to the line A (that is, the output signal S(N)) is chosen and supplied to the sampling analog switch 3b. Here again, because the leftmost sampling analog switch 3b is connected to the dummy pixel column 13b via the dummy signal line DSL, the leftmost sampling analog switch 3b does not contribute to the actual displaying.

Moreover, in the switching circuits 2, because the line B is chosen when the shifting directions switching signal LR is low level (in other words, when the leftward shifting is performed), the rightmost switching circuit 2b supplies, to the rightmost sampling analog switch 3b, the dummy signal DSIG of the line B chosen from the inputted dummy signal DSIG and the inputted output signal S(N). Because the rightmost sampling analog switch 3b is connected to the dummy pixel column 13b via the dummy signal line DSL, the rightmost sampling analog switch 3b does not contribute to the actual displaying.

Then, the sampling analog switch 3 following the rightmost sampling analog switch 3b receives the output signal S(N) of the rightmost output stage, and performs sampling of the video data VSIG. Afterwards, the sampling analog switch 3 following the rightmost sampling analog switch 3b supplies the video data VSIG to the second pixel column counted from the right, that is, the rightmost pixel column 12 among the effective pixel columns 12. In the switching circuits 2 and the sampling analog switches 3 after the sampling analog switch 3 following the rightmost sampling analog switch 3b, likewise, signals supplied to the line B are chosen, and the video data VSIG is sequentially supplied to each of the effective pixel columns 12.

Then, in the leftmost switching circuit 2a, which is the last column, the signal supplied to the line B (that is, the output signal S(1)) is chosen and supplied to the sampling analog switch 3a. Here again, because the leftmost sampling analog switch 3a is connected to the dummy pixel column 13a via the dummy signal line DSL, the leftmost sampling analog switch 3a does not contribute to the actual displaying.

Here, it is conceivable to adopt an arrangement in which the dummy signals DSIG are not generated, and the two outmost switching circuits 2a and 2b only receive the output signals respectively supplied from the two outmost output stages of the shift register circuit 1. With such arrangement, however, when that one switching circuit 2a and 2b to which no signal is supplied is chosen, that switching circuit becomes floated, thereby causing a malfunction of the driving circuit. Therefore, by thus supplying the dummy signals to the switching circuits 2a and 2b, it is possible to prevent such malfunction from occurring.

Here, it is preferable that the dummy signal DSIG is low level. This is because, if the dummy signal DSIG is high level, one of the sampling analog switches 3a and 3b is always turned ON to continuously supply the video data VSIG, which is shared by the effective pixel columns 12, to the one of the sampling analog switches 3a and 3b. Thus, there is a possibility that the effective pixel columns 12 are adversely affected by the continuous supply of the video data VSIG to the one of the sampling analog switches 3a and 3b.

As described above, the source driver 14 is capable of switching as to which of the sampling analog switches 3 receives the output signal from which of the output stages of the shift register circuit 1 appropriately in accordance with the shifting directions. This is attained by providing, between the shift register circuit 1 for two directions and the sampling analog switches 3 that turn ON and OFF in accordance with the output signals from the output stages of the shift register circuit 1, the switching circuits 2, each of which supplies, to one of the two adjacent sampling analog switches 3 connected thereto, one of output signals S(1) to S(N) supplied from the output stages of the shift register circuit 1 in accordance with the shifting directions switching signal LR.

With this arrangement, it is possible to provide a driving circuit suitable for many purposes, capable of (A) switching shifting directions without needing change to external input signals inputted to the shift register circuit 1 and (B) switching the shifting directions with a simple arrangement even if there are an even number of signal lines that are to be driven.

Note that, although a source driver 14 that is a data signal line driving circuit is shown as an example here, a driving circuit of the present invention is not limited to this. For example, a driving circuit of the present invention may be applied to the gate driver 35 in FIG. 7, that is, a scanning signal line driving circuit.

The source driver 14 in FIG. 1 discussed here as an example is that of m=1 so that N, which is the total number of the output stages of the shift register circuit 1, and is equal to n+m ("m" is a positive odd number), becomes an odd number. However, the present invention is not limited to this arrangement. It is only necessary that "m" is a positive odd number. Therefore, a value of "m" may be decided according to necessity, such as how many of the dummy pixel columns 13 are necessary.

Figure 11:
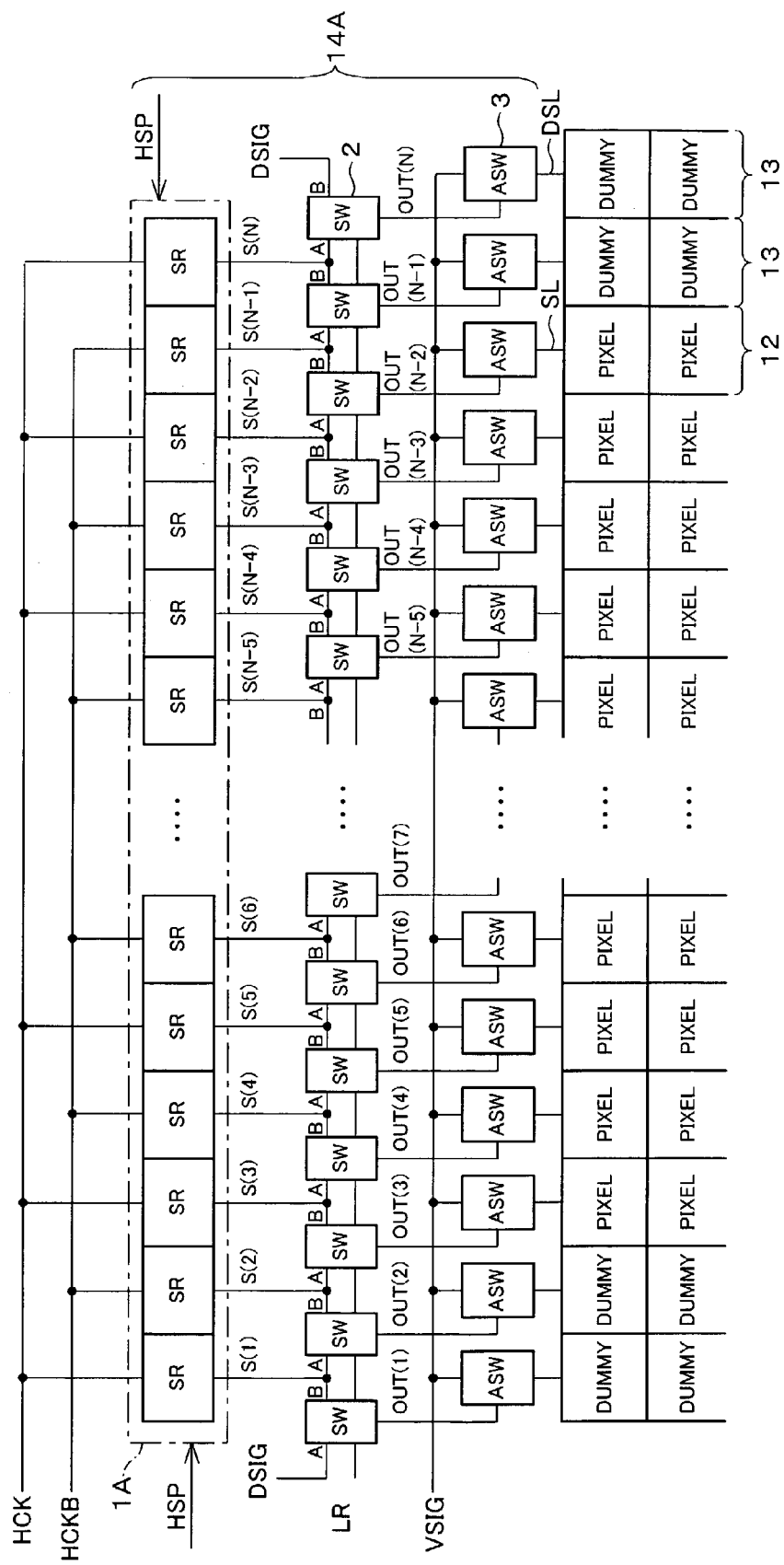
FIG. 11 is a block diagram illustrating an arrangement of a source driver of another embodiment of the present invention.

FIG. 11 shows, as another embodiment of the present invention, an arrangement of a source driver 14A of m=3, which is a data signal line driving circuit. For the purpose of explanation, sections having the same function as in the source driver 14 are labeled with the same referential marks, and descriptions thereof are omitted.

According to this arrangement, the shift register circuit 1A has three extra output stages. One of the three extra output stages is always necessary in order to prevent the shifting of the pixels by one column that occurs between the shifting directions. The other two of the three extra output stages are provided so as to deal with the dummy pixel columns 13. According to this arrangement, there are provided two of the dummy pixel columns 13 at both ends of the effective pixel columns 12. The displaying is affected by the differences in the state of pixels and in the components of the capacitors between the central portion and the end portion of the display section 11 including the effective pixel columns 12. However, by thus providing necessary number of the dummy pixel columns 13, it is possible to cause the end portion to have similar state of the pixels and the components of the capacitors to those of the central portion, thereby realizing even displaying. Because the dummy pixel columns 13 are masked as described above also in this case, the dummy pixel columns do not contribute to the displaying. Therefore, the number of the dummy pixel columns provided may be any number.

Figure 12:
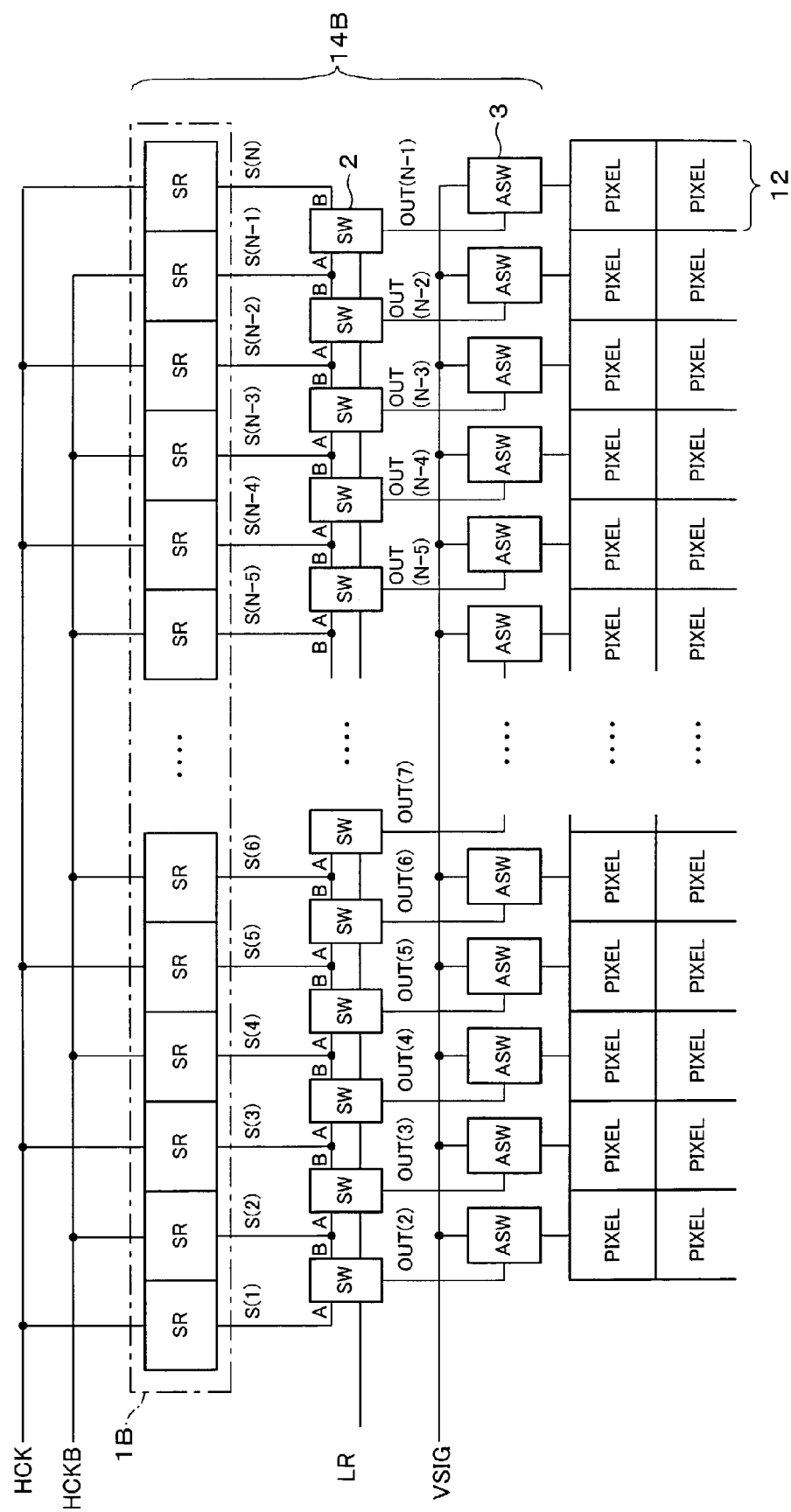
FIG. 12 is a block diagram illustrating an arrangement of a source driver of yet another embodiment of the present invention.

Further, although the source driver 14 in FIG. 1 has the dummy pixel columns 13a and 13b, and, for the dummy pixel columns 13a and 13b, the sampling analog switches 3a and 3b and the switching circuits 2a and 2b, as shown in FIG. 12, it is possible to remove the dummy pixel columns 13a and 13b, or all of the dummy pixel columns 13a and 13b, and, for the dummy pixel columns 13a and 13b, the sampling analog switches 3a and 3b and the switching circuits 2a and 2b. In the latter case, the arrangement of the source driver circuit is the simplest.

According to this arrangement, N, which is the number of the output stages of the shift register circuit 1B, is n+1. That is, the shift register circuit 1B has one extra stage in addition to the n number of stages (that is, the number of the effective pixel columns 12). The number of the switching circuit and the number of the sampling analog switches are n.

Figure 13:
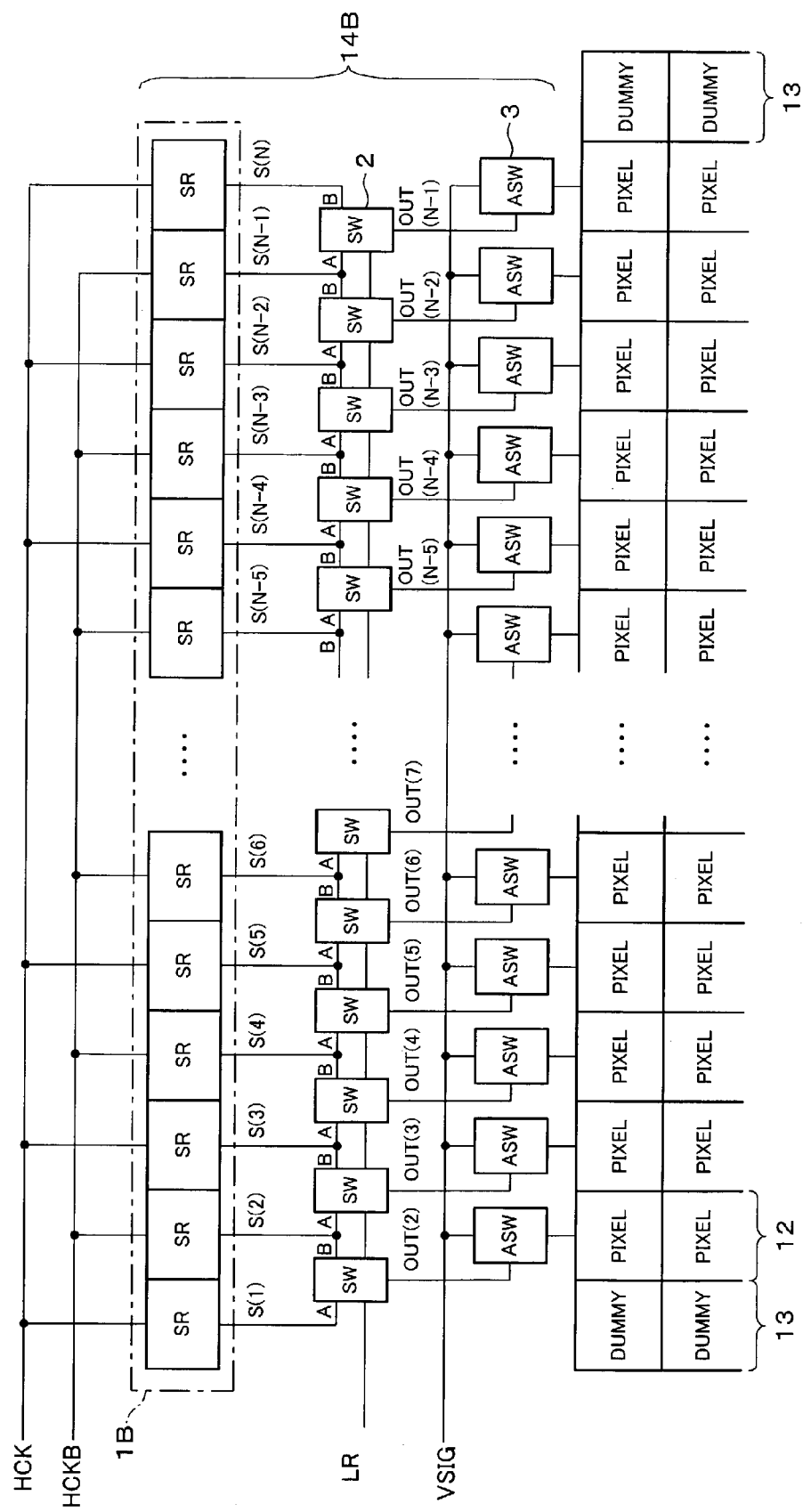
FIG. 13 is a block diagram illustrating an arrangement of a source driver of further embodiment of the present invention.

Because the displaying is affected by the difference in the state of the pixels and in the components of the capacitors between the central portion and the end portion of the display section 11 including the effective pixel columns 12, as described above, it is preferable that, as in the arrangement shown in FIG. 13, at least the necessary number of the dummy pixel columns 13 are provided even if the switching circuit 2 and the sampling analog switch 3, which correspond to the dummy pixel columns, are not provided.

According to the arrangements in FIG. 12 and FIG. 13, unlike the output signals supplied from the other output stages of the shift register circuit 1B, the output signals respectively supplied from the two outmost output stages of the shift register circuit 1B are supplied only to the two outmost switching circuits, respectively. This causes signal loads to be different between the two outmost output stages and the other output stages of the shift register circuit 1B. The different signal loads lead to different delay time of the signals. This changes time (electrical charging time) required for sampling and outputting the video data VSIG. Thus, there is a fear that the displaying is adversely affected. Therefore, it is preferable that, as in the arrangement shown in FIG. 1, the switching circuits 2a and 2b are provided in addition to the other switching circuits, the number of which corresponds to the n number of the signal lines connected to the effective pixel columns 12, so that the output signals supplied from the two outmost output stages of the shift register circuit 1 are, in a similar manner to the output signals respectively supplied from the other output stages of the shift register circuit 1, respectively supplied to the two adjacent ones of the switching circuits respectively connected to the two outmost output stages of the shift register circuit 1. The number of the switching circuits provided in addition may be decided in accordance with the number of the output stages provided in addition.

Figure 5:
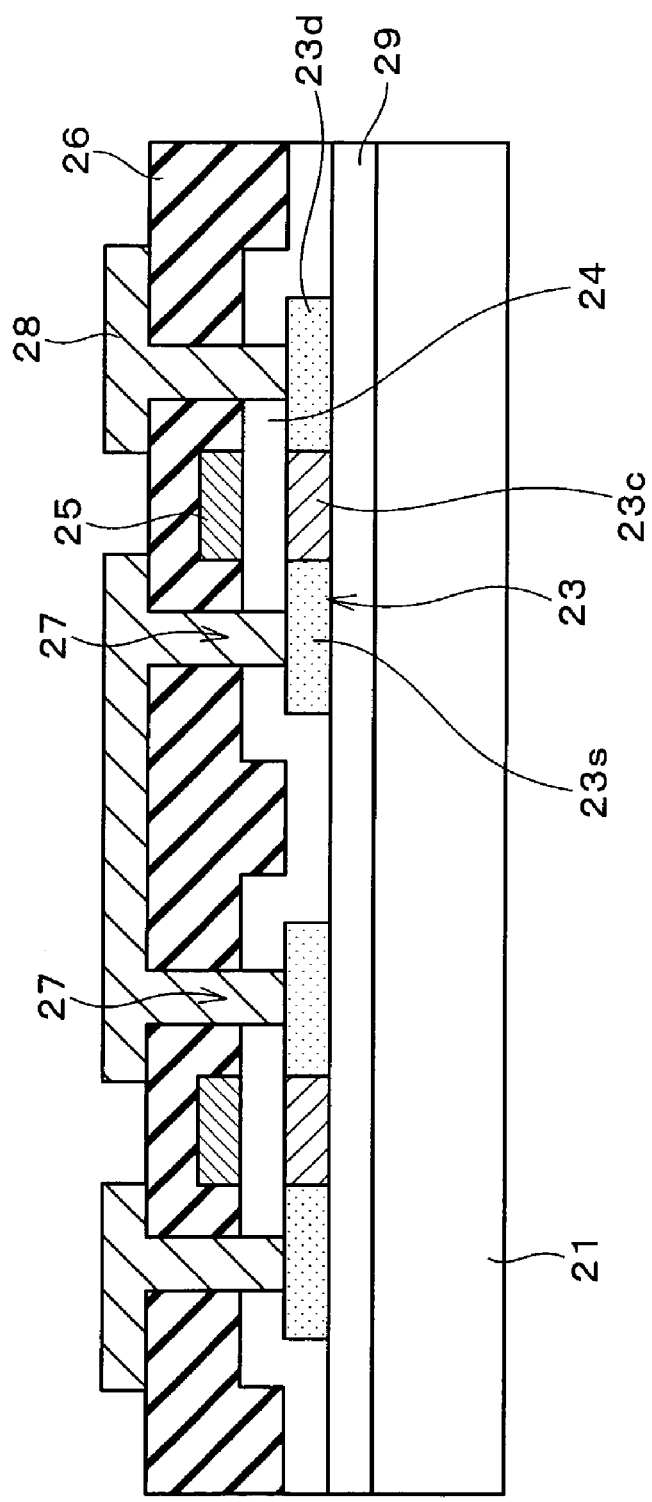
FIG. 5 is a cross-sectional view showing an arrangement of a polycrystalline silicon thin film transistor adopted as an active element in an image display device including the source driver.
Figure 6:
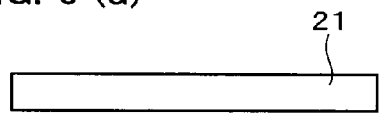
FIGS. 6 (a) to (k) are cross-sectional views illustrating an example of manufacturing steps of the polycrystalline silicon thin film transistor.
Figure 6:
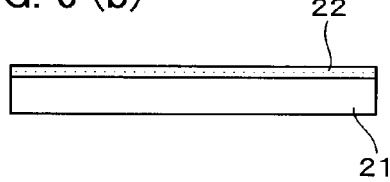
Figure 6:
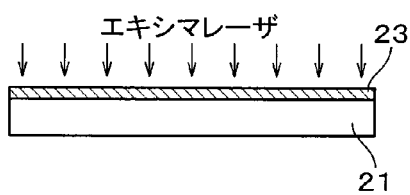
Figure 6:
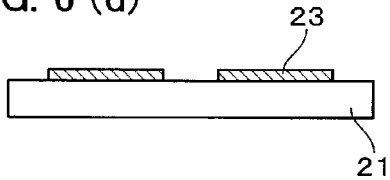
Figure 6:
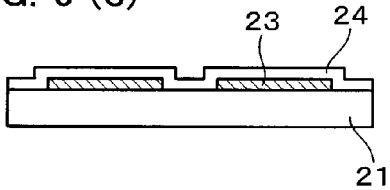
Figure 6:
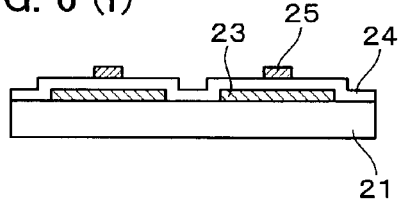
Figure 6:
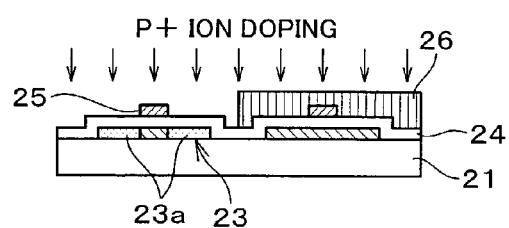
Figure 6:
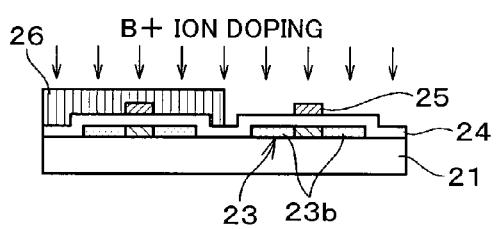
Figure 6:
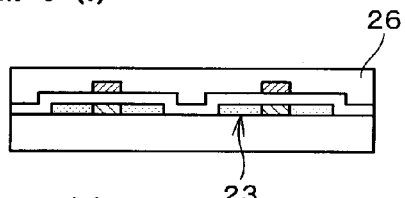
Figure 6J:
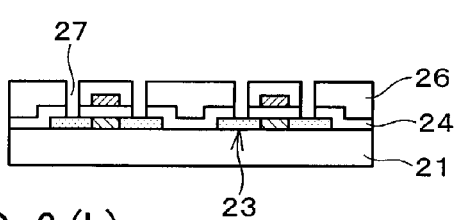
Figure 6:
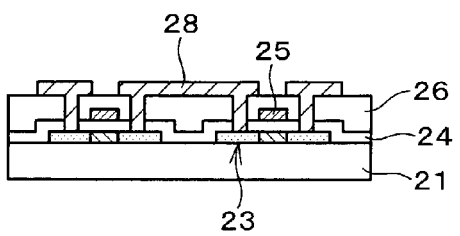

Next, FIG. 5 shows an example of an arrangement of a polycrystalline silicon TFT, which enables to provide such source driver 14 and the display section 11 on a single substrate by the same steps in which the TFT 30 (see FIG. 7) for driving pixels in the display section 11 is manufactured.

The TFT shown in FIG. 5 is that of a forward stagger (top gate) structure, in which a polycrystalline silicon thin film 23 on an insulating substrate 21 is used as an active layer. The polycrystalline silicon thin film 23 is formed on the insulating substrate 21, a silicon oxide film being provided therebetween. The polycrystalline silicon thin film 23 is divided into a source region 23s, a drain region 23d, and a channel region 23c. On the polycrystalline silicon thin film 23, a gate electrode 25 is provided, a gate insulating film being provided therebetween, at a position corresponding to the channel region 23c. On the gate electrode 25, a metal wire 28 is provided, an interlayer insulating film 26 being provided therebetween. The metal wire 28 is electrically connected to the source region 23s and the drain region 23d via contact holes 27.

Note that the structure of the TFT is not limited to the forward stagger structure, and that the structure of the TFT may be backward stagger structure and the like that is different from the forward stagger structure.

By using such polycrystalline silicon TFT, it is possible to provide a gate driver (a scanning signal line driving circuit) and a source driver (a data signal line driving circuit) that have practical driving capability on the single substrate on which the pixel arrays are provided by substantially the same manufacturing steps as those of the pixel arrays.

It is possible to obtain the polycrystalline silicon TFT shown in FIG. 5 as follows, for example. The following briefly describes manufacturing process of forming the polycrystalline silicon TFT at a temperature of 600° C. or lower. FIGS. 6(a) to 6(k) illustrate an example of manufacturing steps of the TFT.

First, excimer laser is radiated onto an amorphous silicon thin film 22 provided on the insulating substrate 21 made of grass and the like so as to form the polycrystalline silicon thin film 23 (see FIGS. 6(a) to 6(c)). Next, patterning is performed so as to turn the polycrystalline silicon thin film 23 into a desired shape (see FIG. 6(d)) so as to form a gate insulating film 24 made of silicon dioxide and the like (see FIG. 6(e)). Further, after the gate electrode 25 is formed out of aluminum and the like (see FIG. 6(f)), the gate electrode 25 is covered with a resist 26 as appropriate. Then, an impurity (phosphorus for an n-type region 23a, and boron for a p-type region 23b) is filled into the source region 23c and the drain region 23d of the TFT on the polycrystalline silicon thin film 23 (see FIGS. 6(g) and 6(h)).

After that, the interlayer insulating film 26 made of silicon dioxide, silicon nitride, or the like is disposed (see FIG. 6(i)). Then, a contact hole 27 is opened (see FIG. 6(j)), and a metal wire 28 made of aluminum and the like is formed.

Afterwards, in case the image display device is a liquid display device, a transparent electrode (for a transparent liquid display device), a reflection electrode (for a reflective liquid display device), or the like is further formed, with another interlayer insulation film being between the metal wire 28 and the electrode.

In such manufacturing steps, because the highest process temperature is 600° C., at which the gate insulating film 24 is formed, it is possible to use a high heat resistant glass such as 1737 glass (a product of Corning. Inc., U.S.A.) as the insulating substrate 21. Because it is possible, by forming the polycrystalline silicon TFT at the temperature of 600° C., to use an inexpensive glass substrate having large area, a lower price and larger area of the image display device are realized.

As described above, a driving circuit of the present invention includes a shift register circuit for shifting a start pulse in two directions in accordance with two clock signals having different phases, the driving circuit driving a plurality of signal lines by respectively using output signals supplied from output stages of the shift register circuit, further including: a signal line switching circuit section, associating each signal line with two adjacent ones of the output stages (in other words, allowing each signal line to be driven alternately by two adjacent ones of the output stages), one of which follows the other, the signal line switching circuit being switchable so that the signal lines are driven either by the following output stages or by the followed output stages.

According to the above arrangement, by the signal line switching circuit section switching over, the signal lines are, in the switching-over manner and in concert, driven either by the following output stages or by the followed output stages.

Figure 9:
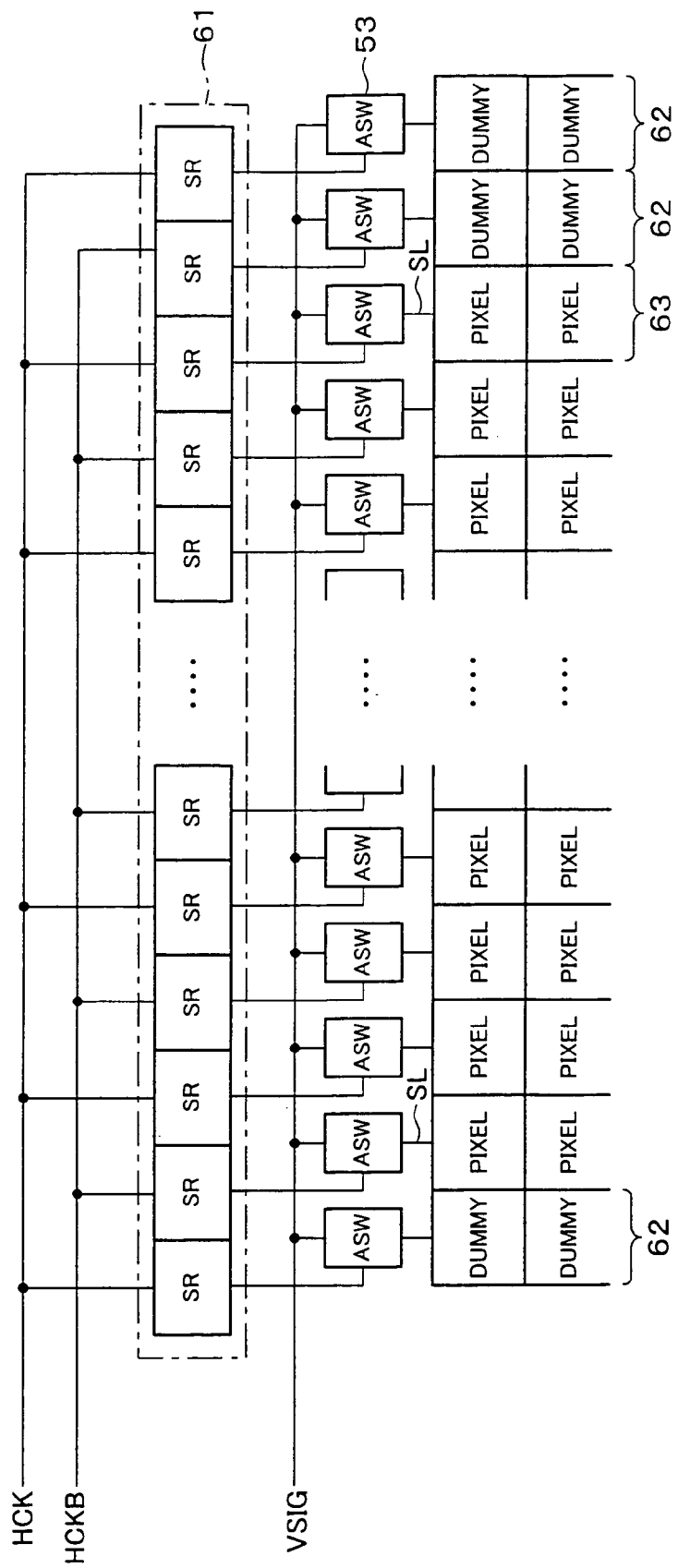
FIG. 9 is a block diagram illustrating an arrangement of another conventional source driver.
Figure 10:
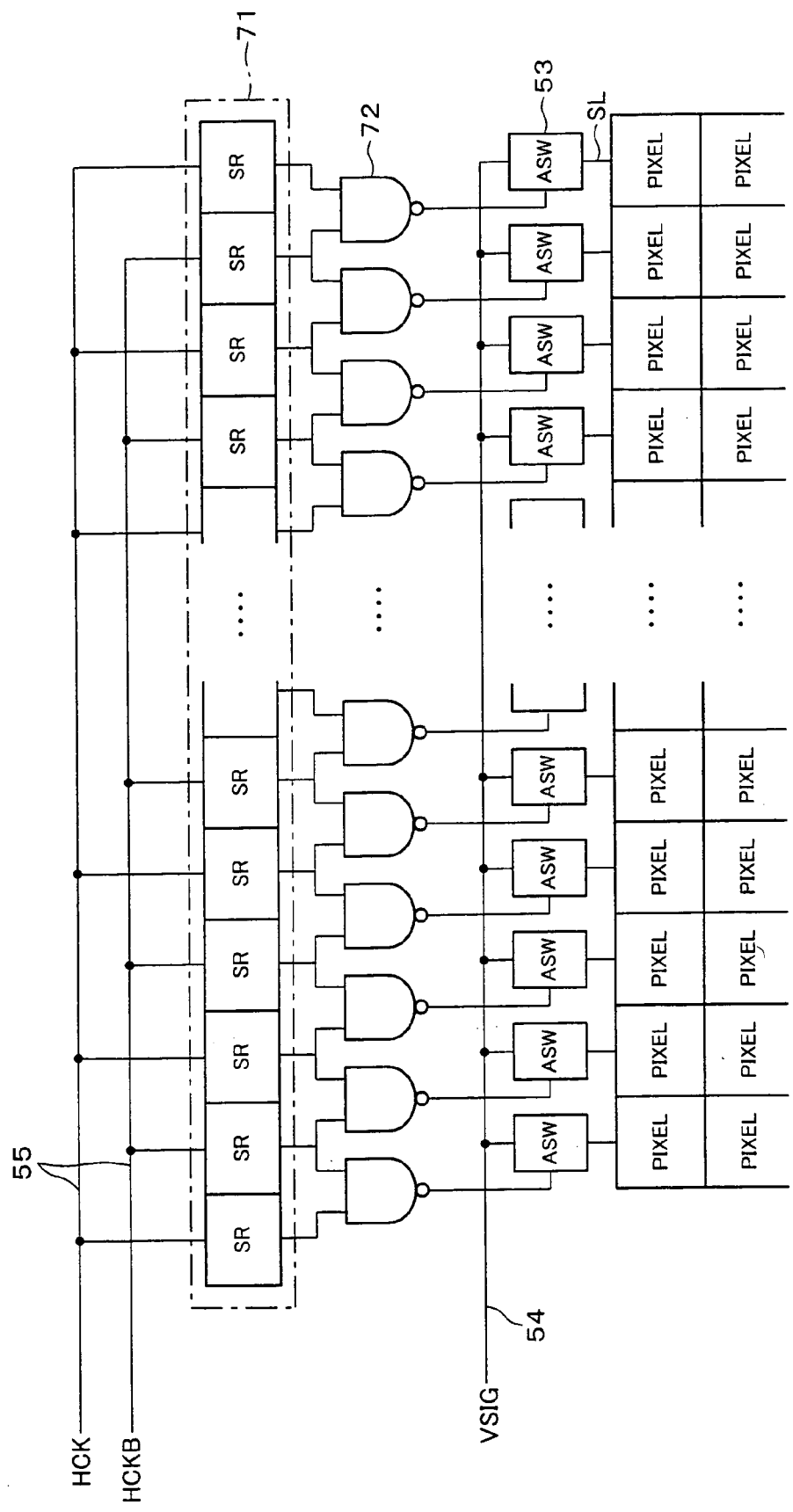
FIG. 10 is a block diagram illustrating an arrangement of yet another conventional source driver.

Assuming, for example, that the number of output stages of the shift register circuit is an odd number, thereby making it possible to deal with a higher clock frequency without needing conversion of external input signals, and that an even number of signal lines are driven by the odd number of output signals, a displayed image is inevitably shifted by one pixel column between the rightward shifting and the leftward shifting, if relationship between the signal lines and output stages is fixed, as shown by the driving circuit in FIG. 9 as an example. However, by providing the signal line switching circuit section for switching over as to which signal line is driven by which output stage, between the rightward shifting and the leftward shifting, thus shifting the image by one pixel column, it is possible to eliminate the shifting of pixels caused by the different shifting directions.

Although a plurality of pixels aligned in a column along the signal lines are referred to here as a pixel column, this is only for the purpose of explanation. Thus, the term "pixel column" may refer not only to the pixels, among the pixel arrays, aligned along the data signal lines, but, alternatively, also to the pixels aligned along the scanning signal lines, though such pixels are usually referred to as a row.

Further, according to the driving circuit of the present invention, the signal line switching circuit may be so arranged as to switch over, in synchronization with timing at which shifting directions of the shift register circuit are switched over, as to which signal line is driven by which output stage.

As described above, because the shifting of the image occurs due to the switching between the rightward and leftward directions, by the signal line switching circuit switching over, in synchronization with timing at which shifting directions of the shift register circuit are switched over as to which signal line is driven by which output stage, the shifting of the image never becomes visible. Therefore, it is possible to directly use the shifting directions control signal.

The signal line switching circuit may be so arranged, for example, as to include a switching circuit, which associates each signal line with two adjacent ones of the output stages, one of which follows the other, the switching circuit receiving the output signals supplied from the two adjacent ones of the output stages and a control signal indicative of the shifting direction, and outputting, in accordance with the control signal, one of the output signal outputted from the followed output stage and the output signal outputted from the following output stage.

A driving circuit of the present invention may also be so arranged that the number of the output stages of the shift register circuit is n+1, and the number of the switching circuits in the switching circuit section is n, where n is a positive even number representing the number of the signal lines, which corresponds to the number of effective pixel columns; and that the signal lines connected to the outmost effective pixel columns are alternatively driven by the two outmost output stages respectively connected thereto in accordance with the switching-over of the signal line switching circuit section.

According to this arrangement, the number of the signal lines is n, which corresponds to the number of effective pixel columns, where n is a positive even number; the number of the output stages of the shift register circuit is n+1, which is the smallest possible number; and the number of the switching circuits in the switching circuit section is also n. And one of the output signals supplied from the two outmost output stages of the shift register circuit drives, in accordance with the shifting directions, the signal lines connected to the outmost effective pixel columns. Therefore, the other of the output signals supplied from the two outmost output stages of the shift register circuit is not used.

Thus, in the driving circuit of the present invention that prevents the shifting of image from occurring between the shifting directions, the number of the output stages of the shift register circuit and the number of the switching circuits in the signal line switching circuit become as small as possible, thereby attaining smaller layout area.

According to the arrangement in which the smallest possible numbers of the output stages of the shift register circuit and the switching circuits in the signal line switching circuit section are provided, unlike the output signals supplied from the other output stages of the shift register circuit, the output signals respectively supplied from the two outmost output stages of the shift register circuit are supplied only to the two outmost switching circuits, respectively. This leads to different signal loads between the two outmost output stages and the other output stages of the shift register circuit. Therefore, there is a fear that a problem is caused in which, for example, the displaying is adversely affected by different delay time and the like.

In order to prevent such problem, it is possible to so arrange a driving circuit of the present invention that the number of the output stages of the shift register circuit is n+m, and the number of the switching circuits in the signal line switching circuit section is n+m+1, where n is a positive even number representing the number of the signal lines, which corresponds to the number of the effective pixel columns, and m is a positive odd number; and the signal lines connected to the outmost effective pixel columns are alternatively driven by the output signals respectively outputted from the inmost two output stages among the (m+1)/2 number of outmost output stages of the shift register circuit.

According to this arrangement, the number of the output stages of the shift register circuit is n+m, which is a smallest possible number, and the number of the switching circuits in the signal line switching circuit section is n+m+1, where n is a positive even number representing the number of the signal lines, which corresponds to the number of the effective pixel columns, and m is a positive odd number; and the signal lines connected to the outmost effective pixel columns are alternatively driven by the output signals respectively outputted from the inmost two output stages among the (m+1)/2 number of outmost output stages of the shift register circuit.

With this arrangement, because all the output signals respectively supplied from the output stages of the shift register circuit are supplied to the two adjacent ones of the switching circuits, respectively, the signal loads do not differ from each other. Therefore, there is no fear that the problem above is caused.

Moreover, a driving circuit of the present invention may be so arranged that the number of the output stages of the shift register circuit is n+m, and the number of the switching circuits in the signal line switching circuit section is n+m+1, so as to deal with the number of the signal lines associated with a dummy pixel column provided next to a group of effective pixel columns, where n is a positive even number representing the number of the signal lines, which corresponds to the number of the effective pixel columns, and m is a positive odd number; and the signal lines connected to the outmost effective pixel columns are alternatively driven by the output signals respectively outputted from the inmost two output stages among the (m+1)/2 number of outmost output stages of the shift register circuit.

According to this arrangement, because the output stages of the shift register circuit and the switching circuits in the signal line switching circuit section are provided in addition, so that the signal loads of the output stages of the shift register circuit do not differ from each other, and are connected to the dummy pixel columns, there is an advantage that it is possible to drive the dummy pixel columns according to necessity.

It is preferable that the two outmost switching circuits among the n+m+1 number of the switching circuits respectively receive dummy signals as well as the output signals supplied from the outmost output stages of the shift register circuit connected thereto.

If the two outmost switching circuits only receive the output signals respectively supplied from the two outmost output stages of the shift register circuit, there is a fear that a malfunction of the driving circuit occurs because that one of the outmost switching circuits to which no signal is supplied become floated when that one of the outmost switching circuits is chosen. However, by thus supplying the dummy signals to the two outmost switching circuits, it is possible to prevent such malfunction from occurring.

A driving circuit of the present invention may also be so arranged as to supply output signals supplied from the switching circuits in the signal line switching circuit section to analog switch circuits, into which the switching circuits in the signal line switching circuit section outputs the output signals, for sampling another signals in accordance with the output signals supplied from the switching circuits, and so that the analog switch circuits are not to be turned on because the dummy signals are OFF-level signals.

If the driving circuit of the present invention is applied to a data signal line driving circuit, the output signals supplied from the switching circuits in the signal line switching circuit section are outputted to analog switch circuits for sampling another signals in accordance with the output signals supplied from the switching circuits. The analog switch circuits, in accordance with the output signals supplied from the switching circuits, then sample separately inputted video signals and output thus sampled signals to the signal lines. In such a case, if the analog switch circuit for the dummy pixel column is always ON, there is a fear that the sampling of signals are adversely affected, thereby shifting sampled voltage from an original value. By causing, to be OFF-level signals, the dummy signals for controlling operation of the analog switches for the dummy pixel column, it is possible to prevent such a problem.

A driving circuit of the present invention including (a) a shift register circuit for shifting a start pulse in two directions in accordance with two clock signals having different phases and (b) a plurality of signal lines that are respectively driven by output signals supplied from respective output stages of the shift register circuit, may also be so arranged as to further include a switching circuit section for switching over as to which signal line is driven by which output stage of the shift register circuit.

Further, a driving circuit of the present invention may also be so arranged that the switching circuit section switches over, in synchronization with timing at which shifting directions of the shift register circuit are switched over, as to which signal line is driven by which output stage.

Moreover, a driving circuit of the present invention may be so arranged that the driving circuit is capable of supplying, to dummy signal lines, output signals supplied from the $(m+1)/2$ number of outmost output stages of the shift register circuit, where the number of the signal lines is n, the number of output stages of the shift register circuit is $N=n+m$, where n is a positive even number, and m is a positive odd number, and that the signal line driven by the inmost two output stages among the $(m+1)/2$ number of outmost output stages is switched over between the dummy signal line and the effective signal line, in accordance with the shifting directions.

Here, the signal lines are such as data signal lines to which video signals and the like are supplied, and scanning signal lines to which scanning signals and the like are supplied, for example.

According to the above arrangement, it is possible, by using the switching circuits, to switch the signal lines that are respectively driven by the output signals from the output stages of the shift register circuit. Therefore, for example, by applying the arrangement of the driving circuit to the source driver, that is, by switching the sampling analog switches that respectively receive the output signals from the output stages of the shift register circuit, it is possible to appropriately choose which sampling analog switches receive which output signals from the output stages of the shift register circuit, respectively.

For example, when it is desired that an even number of signal lines (the source lines with respect to the source driver) be driven by an odd number of outputs, where the number of output stages of the shift register N is an odd number so as to make it possible to deal with a higher clock frequency without needing conversion of external input signals, positions of the dummy signal lines, which are driven by the m number of dummy output stages that are provided so that the number of the output stages becomes an odd number, are fixed at a right end or at a left end of a group of effective signal lines for actual use. Because the number of the dummy signals is an odd number, it is not possible to evenly provide the dummy signal lines at both ends of the group of effective signal lines for actual use. If the positions of the dummy signal lines are fixed in an uneven manner, the shift of one pixel column occurs when the shifting directions are switched.

However, by adopting the above arrangement, in which the dummy signal lines are evenly provided at both ends of the group of effective signal lines, and the dummy signal lines to be used is appropriately switched in accordance with switching of the shifting directions, so as to make it possible to switch the signal lines to be respectively driven by the output signals from the output stages of the shift register circuit, it is possible to solve the problem of where to allocate the dummy signal lines, the problem occurring when the shifting directions are switched.

Specifically, by so arranging that it is possible to supply the outputs from the $(m+1)/2$ number of outmost output stages of the shift register circuit to the dummy signal line, where the number of the effective signal lines is n, which is a positive even number, the number of the output stages of the shift register circuit is $N=n+m$, and m is a positive odd number, the signal lines connected to the outmost effective pixel columns are alternatively driven by the output signals respectively outputted from the inmost two output stages among the $(m+1)/2$ number of outmost output stages of the shift register circuit.

Moreover, by providing the dummy signal lines to the m number of stages of signal lines that are provided at said both ends, it is possible to keep load carrying capacity of the m number of stages of signal lines the same as that of the other output stages.

As described above, according to the present invention, it is possible to provide a driving circuit suitable for many purposes, capable of (A) switching shifting directions without needing change to external input signals inputted to the shift register circuit and (B) switching the shifting directions with a simple arrangement even if there are an even number of signal lines that are to be driven.

In a display device of the present invention including (i) pixel arrays including a plurality of effective pixels for displaying an image, (ii) a data signal line driving circuit for supplying a video signal to the pixel arrays, and (iii) a scanning signal line driving circuit for controlling writing of the video signal into the pixels, at least one of the data signal line driving circuit and the scanning signal line driving circuit includes the driving circuit of the present invention.

As described above, the driving circuit of the present invention is suitable for many purposes, and capable of (A) switching shifting directions without needing change to external input signals inputted to the shift register circuit and (B) switching the shifting directions with a simple arrangement even if there are an even number of signal lines that are to be driven.

Therefore, the display device of the present invention including such driving circuit in at least one of the data signal line driving circuit and the scanning signal line driving circuit is capable of ensuring flexibility in placing the display device while keeping a simple arrangement of said at least one of the data signal line driving circuit and the scanning signal line driving circuit.

It is preferable that a display device of the present invention further includes a dummy pixel column provided next to a group of effective pixel columns. By thus providing the dummy pixel column, it is possible to equalize capacity of the pixels at both ends of the pixel arrays and capacity of pixels at the rest of portions, thereby improving displaying quality. Further, it is preferable that the dummy pixel column in the pixel arrays is masked so as not to contribute to displaying.

According to the above arrangement, by providing at least one of the data signal line driving circuit and the scanning signal line driving circuit on the single substrate on which the pixel arrays are provided, it is possible to reduce costs for connecting, to the pixel arrays, said at least one of the data signal line driving circuit and the scanning signal line driving circuit and to improve reliability of the same.

A display device of the present invention may also be so arranged that, (i) active elements constituting the pixels and (ii) active elements in said at least one of the data signal line driving circuit and the scanning signal line driving circuit provided on the single substrate on which the pixels arrays are provided are thin film transistors made of polycrystalline silicon.

According to the above arrangement, by forming, out of polycrystalline silicon, (i) active elements constituting the pixels and (ii) active elements in said at least one of the data signal line driving circuit and the scanning signal line driving circuit provided on the single substrate on which the pixel arrays are provided, it is possible to form each of said driving circuits and the pixels on the single substrate by a single process, thereby further reducing manufacturing costs for the display device.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A driving circuit comprising a shift register circuit for shifting a start pulse in two directions in accordance with two clock signals having different phases, the driving circuit driving a plurality of signal lines by respectively using output signals supplied from output stages of the shift register circuit, further comprising:

a signal line switching circuit section, associating each signal line with two adjacent ones of the output stages, one of which follows the other, the signal line switching circuit section being switchable so that the signal lines are driven either by the following output stages or by the followed output stages, and wherein, for each of a plurality of the output stages of the shift register circuit an output signal from the output stage is provided to two different switching circuits of the switching circuit section.

2. The driving circuit as set forth in claim 1, wherein:

the signal line switching circuit section switches over, in synchronization with timing at which shifting directions of the shift register circuit are switched over as to which signal line is driven by which output stage.

3. The driving circuit as set forth in claim 1, wherein:

the signal line switching circuit section includes a switching circuit, which connects each signal line with two adjacent ones of the output stages, one of which follows the other; and the switching circuit receives the output signals supplied from the two adjacent ones of the output stages and a control signal indicative of the shifting direction, and outputs to the signal line connected thereto, in accordance with the control signal, one of the output signal outputted from the followed output stage and the output signal outputted from the following output stage.

4. The driving circuit as set forth in claim 3, wherein:

the number of the output stages of the shift register circuit is n+1, and the number of the switching circuits in the switching circuit section is n, where n is a positive even number representing the number of the signal lines, which corresponds to the number of effective pixel columns; and the signal lines connected to the outmost effective pixel columns are alternatively driven by the two outmost output stages respectively connected thereto in accordance with the switching-over of the signal line switching circuit section.

5. A driving circuit comprising a shift register circuit for shifting a start pulse in two directions in accordance with two clock signals having different phases, the driving circuit driving a plurality of signal lines by respectively using output signals supplied from output stages of the shift register circuit, further comprising:

a signal line switching circuit section, associating each signal line with two adjacent ones of the output stages, one of which follows the other, the signal line switching circuit section being switchable so that the signal lines are driven either by the following output stages or by the followed output stages, the signal line switching circuit section includes a switching circuit, which connects each signal line with two adjacent ones of the output stages, one of which follows the other;

the switching circuit receives the output signals supplied from the two adjacent ones of the output stages and a control signal indicative of the shifting direction, and outputs to the signal line connected thereto, in accordance with the control signal, one of the output signal outputted from the followed output stage and the output signal outputted from the following output stage;

wherein: the number of the output stages of the shift register circuit is n+m, and the number of the switching circuits in the signal line switching circuit section is n+m+1, where n is a positive even number representing the number of the signal lines, which corresponds to the number of the effective pixel columns, and m is a positive odd number; and the signal lines connected to the outmost effective pixel columns are alternatively driven by the output signals respectively outputted from the inmost two output stages among the (m+1)/2 number of outmost output stages of the shift register circuit.

6. The driving circuit as set forth in claim 5, wherein:

the number of the switching circuit associated with a dummy pixel column provided next to a group of effective pixel columns is counted in the n+m+1.

7. The driving circuit as set forth in claim 5, wherein:

the two outmost switching circuits among the n+m+1 number of the switching circuits respectively receive dummy signals as well as the output signals supplied from the outmost output stages of the shift register circuit connected thereto.

8. The driving circuit as set forth in claim 7, further comprising:

analog switch circuits, into which the switching circuits in the signal line switching circuit section output the output signals, for sampling another signals in accordance with the output signals supplied from the switching circuits, the analog switch circuits being not to be turned ON because the dummy signals are OFF-level signals.

9. A display device comprising (i) pixel arrays including a plurality of effective pixels for displaying an image, (ii) a data signal line driving circuit for supplying a video signal to the pixel arrays, and (iii) a scanning signal line driving circuit for controlling writing of the video signal into the pixels, wherein:

at least one of the data signal line driving circuit and the scanning signal line driving circuit includes a shift register circuit for shifting a start pulse in two directions in accordance with two clock signals having different phases, the driving circuit driving a plurality of signal lines by respectively using output signals supplied from output stages of the shift register circuit, wherein the driving circuit further includes a signal line switching circuit section, associating each signal line with two adjacent ones of the output stages, one of which follows the other, the signal line switching circuit being switchable so that the signal lines are driven either by the following output stages or by the followed output stages, and wherein for each of a plurality of the output stages of the shift register circuit an output signal from the output stage is provided to two different switching circuits of the switching circuit section.

10. The display device as set forth in claim 9, wherein the pixel arrays further includes:
- a dummy pixel column provided next to a group of effective pixel columns.

11. The display device as set forth in claim 10, wherein:
the dummy pixel column among the pixel arrays is masked so as not to contribute to displaying.

12. The display device as set forth in claim 9, wherein:
said at least one of the data signal line driving circuit and the scanning signal line driving circuit is provided on a single substrate on which the pixel arrays are provided.

13. The display device as set forth in claim 12, wherein:
(i) active elements constituting the pixels and (ii) active elements in said at least one of the data signal line driving circuit and the scanning signal line driving circuit are polycrystalline silicon thin film transistors.

14. A display device comprising (i) pixel arrays including a plurality of effective pixels for displaying an image, (ii) a data signal line driving circuit for supplying a video signal to the pixel arrays, and (iii) a scanning signal line driving circuit for controlling writing of the video signal into the pixels, the data signal line driving circuit, wherein:
the data signal line driving circuit includes a driving circuit for driving a plurality of signal lines comprising a shift register circuit for shifting a start pulse in two directions in accordance with two clock signals having different phases and an analog switch circuit, which is provided for each signal line, for sampling a video signal by respectively using output signals supplied from output stages of the shift register circuit;
the driving circuit includes a signal line switching circuit section;
the signal line switching circuit section includes a switching circuit for associating each signal line with two adjacent ones of the output stages, one of which follows the other, receiving the output signals supplied from the two adjacent ones of the output stages and a control signal indicative of the shifting direction, and being switchable so that the signal lines are driven either by the following output stages or by the followed output stages;
the number of the output stages of the shift register circuit is n+m, and the number of the switching circuits in the signal line switching circuit section is n+m+1, so as to deal with the number of the signal lines associated with a dummy pixel column provided next to a group of effective pixel columns, where n is a positive even number representing the number of the signal lines, which corresponds to the number of the effective pixel columns, and m is a positive odd number;
the signal lines connected to the effective pixel columns are alternatively driven by the output signals supplied from the inmost two output stages among the (m+1)/2 number of outmost output stages of the shift register circuit; and
the two outmost switching circuits among the n+m+1 number of the switching circuits respectively receive dummy signals, which are OFF-level signals that do not turn ON the analog switch circuits, as well as the output signals supplied from the outmost output stages of the shift register circuit connected thereto.

15. A driving circuit comprising (a) a shift register circuit for shifting a start pulse in two directions in accordance with two clock signals having different phases and (b) a plurality of signal lines that are respectively driven by output signals supplied from respective output stages of the shift register circuit, further comprising:
a group of switching circuits for switching over as to which signal line is driven by which output stage of the shift register circuit;
the driving circuit being capable of supplying, to dummy signal lines, output signals supplied from the (m+1)/2 number of outmost output stages of the shift register circuit, where the number of the signal lines is n, the number of output stages of the shift register circuit is N=n+m, where n is a positive even number, and m is a positive odd number, and
the signal line driven by the inmost two output stages among the (m+1)/2 number of outmost output stages being switched over between the dummy signal line and the effective signal line, in accordance with the shifting directions.

16. The driving circuit as set forth in claim 15, wherein:
the group of switching circuits switches over, in synchronization with timing at which shifting directions of the shift register circuit are switched over as to which signal line is driven by which output stage of the shift register circuit.

* * * * *